United States Patent
Karczewicz et al.

(10) Patent No.: US 8,410,959 B2
(45) Date of Patent: Apr. 2, 2013

(54) VARIABLE LENGTH CODES FOR CODING OF VIDEO DATA

(75) Inventors: Marta Karczewicz, San Diego, CA (US); Xianglin Wang, San Diego, CA (US)

(73) Assignee: QUALCOMM, Incorporated, San Diego, CA (US)

(*) Notice: Subject to any disclaimer, the term of this patent is extended or adjusted under 35 U.S.C. 154(b) by 153 days.

(21) Appl. No.: 12/979,751

(22) Filed: Dec. 28, 2010

(65) Prior Publication Data

US 2011/0248873 A1  Oct. 13, 2011

Related U.S. Application Data

(60) Provisional application No. 61/322,641, filed on Apr. 9, 2010.

(51) Int. Cl.
  *H03M 7/40* (2006.01)
(52) U.S. Cl. .......... 341/67; 376/240; 376/246; 382/233; 382/246; 382/251; 382/245; 341/65
(58) Field of Classification Search .............. 341/50–70; 375/240, 246, 240.05, 240.18, 240.03, E7.231, 375/E7.226, E7.17, E7.144; 382/233, 251, 382/246, 250, 245
See application file for complete search history.

(56) References Cited

U.S. PATENT DOCUMENTS

| | | | | |
|---|---|---|---|---|
| 5,640,020 A | * | 6/1997 | Murakoshi et al. | 250/492.21 |
| 5,694,127 A | * | 12/1997 | Tayama | 341/67 |
| 5,835,145 A | * | 11/1998 | Ouyang et al. | 375/240.2 |
| 6,636,168 B2 | * | 10/2003 | Ohashi et al. | 341/67 |
| 6,956,511 B2 | * | 10/2005 | Thomas et al. | 341/67 |
| 6,959,116 B2 | * | 10/2005 | Sezer et al. | 382/251 |
| 7,113,115 B2 | | 9/2006 | Partiwala et al. | |
| 7,248,191 B2 | * | 7/2007 | Tanaka et al. | 341/67 |
| 7,305,035 B2 | | 12/2007 | Kondo et al. | |
| 7,501,964 B2 | | 3/2009 | Mittal et al. | |
| 7,586,525 B2 | * | 9/2009 | Tamaru et al. | 348/241 |

(Continued)

FOREIGN PATENT DOCUMENTS

| | | |
|---|---|---|
| EP | 1487218 A1 | 12/2004 |
| FR | 2879861 A1 | 6/2006 |

(Continued)

OTHER PUBLICATIONS

International Search Report and Written Opinion—PCT/US2011/031817—ISA EPO—Aug. 3, 2011.

(Continued)

*Primary Examiner* — Lam T Mai
(74) *Attorney, Agent, or Firm* — Todd E. Marlette

(57) ABSTRACT

A method and system for entropy coding can comprise, in response to detecting a first symbol combination comprising first run information indicating a first number of contiguous zero coefficients is greater than a cut-off-run value, assigning a first codeword to a first symbol combination, wherein the first codeword comprises an escape code from a first-level VLC table; and in response to a second symbol combination comprising second run information indicating a second number of contiguous zero coefficients is less than or equal to the cut-off-run value, assigning a second codeword to the second symbol combination, wherein the second codeword is from the first-level VLC table. The system and method can further comprise collecting coding statistics for a set of candidate symbol combinations and adjusting a mapping between codewords of the first-level VLC table and a subset of the set of candidate symbol combinations based on the coding statistics.

60 Claims, 10 Drawing Sheets

U.S. PATENT DOCUMENTS

| | | |
|---|---|---|
| 2004/0125204 A1 | 7/2004 | Yamada et al. |
| 2005/0015249 A1 | 1/2005 | Mehrotra et al. |
| 2006/0119490 A1 | 6/2006 | Lim et al. |
| 2008/0048894 A1 | 2/2008 | Ridge et al. |
| 2008/0165844 A1* | 7/2008 | Karczewicz ............. 375/240.03 |
| 2009/0016440 A1 | 1/2009 | Tian et al. |
| 2009/0097548 A1* | 4/2009 | Karczewicz et al. .... 375/240.03 |
| 2009/0154820 A1 | 6/2009 | Li et al. |
| 2011/0310976 A1* | 12/2011 | Wang et al. .............. 375/240.24 |
| 2012/0082210 A1* | 4/2012 | Chien et al. ............. 375/240.02 |
| 2012/0082230 A1* | 4/2012 | Karczewicz et al. .... 375/240.18 |
| 2012/0147947 A1* | 6/2012 | Chien et al. ............. 375/240.02 |
| 2012/0147970 A1* | 6/2012 | Chien et al. ............. 375/240.23 |
| 2012/0147971 A1* | 6/2012 | Chien et al. ............. 375/240.23 |

FOREIGN PATENT DOCUMENTS

| | | |
|---|---|---|
| WO | WO03084076 A1 | 10/2003 |

OTHER PUBLICATIONS

Jeon B., et al., "Huffman coding of DCT coefficients using dynamic codeword assignment and adaptive codebook selection", Signal Processing. Image Communication, Elsevier Science Publishers, Amsterdam, NL, vol. 12, No. 3, Jun. 1, 1998, pp. 253-262, XP004122852, ISSN: 0923-5965, DOI: 10.1016/S0923-5965(97)00041-6 the whole document.

* cited by examiner

| 0 | 3 | 0 | 1 |
|---|---|---|---|
| 0 | 0 | 0 | 0 |
| -1 | 0 | 0 | 0 |
| 0 | 0 | 0 | 0 |

FIG. 10

VARIABLE LENGTH CODES FOR CODING OF VIDEO DATA

CLAIM OF PRIORITY

This application claims the benefit of U.S. Provisional Application No. 61/322,641, filed Apr. 9, 2010, the entire contents each of which are incorporated herein by reference.

TECHNICAL FIELD

Aspects of this disclosure relate generally to video coding and more particularly to block-based video coding.

BACKGROUND

Digital video capabilities can be incorporated into a wide range of devices, including digital televisions, digital direct broadcast systems, wireless communication devices, personal digital assistants (PDAs), laptop or desktop computers, digital cameras, digital recording devices, video gaming devices, cellular or satellite radio telephones, or the like. Digital video devices implement video compression techniques, such as MPEG-2, MPEG-4, or H.264/MPEG-4 Advanced Video Coding (AVC), to transmit and receive digital video more efficiently. Video compression techniques perform spatial and temporal prediction to reduce or remove redundancy inherent in video signals.

In video coding, video compression generally includes spatial prediction, motion estimation, and motion compensation. In particular, intra-coding relies on spatial prediction to reduce or remove spatial redundancy in video within a given video frame. Inter-coding relies on temporal prediction to reduce or remove temporal redundancy in video within adjacent frames. For inter-coding, a video encoder performs motion estimation to track the movement of matching video blocks between two or more adjacent frames. Motion estimation generates motion vectors, which indicate the displacement of video blocks relative to corresponding video blocks in one or more reference frames. Motion compensation uses the motion vector to generate a prediction video block from a reference frame. After motion compensation, a residual video block is formed by subtracting the prediction video block from the original video block.

The video encoder applies transform, quantization, and entropy coding processes to further reduce the bit rate of the residual block. Entropy coding generally involves the application of arithmetic codes or variable length codes (VLCs) to further compress residual coefficients produced by the transform and quantization operations. Examples include context-adaptive binary arithmetic coding (CABAC) and context-adaptive variable length coding (CAVLC), which may be used as alternative entropy coding modes in some encoders. A video decoder performs inverse operations to reconstruct the encoded video, using the motion information and residual information for each of the blocks.

SUMMARY

Aspects of this disclosure include a coding scheme for digital video data, such as transform block coefficients and residual data, using variable length codes (VLC). Coefficients from each digital video block can be scanned in a certain order and arranged into an ordered array. The disclosure provides, in one aspect, a video coding device comprising a variable length code (VLC) unit configured to perform VLC coding of the digital video block coefficients using symbol combinations that represent one or more VLC parameters. The VLC parameters include run, level, and end of block (EOB) information of coefficients in the coefficient array. The disclosure further provides for a multi-level VLC table, where a first-level VLC tables maps symbol combinations to codewords based on a symbol combination's occurrence probability, and a second-level VLC table comprises a structured code that can be generated dynamically and does not need to be stored. Based on the run information represented by a particular symbol combination, the symbol combination can either be coded as a codeword from the first-level VLC table or as an escape code from the first-level VLC table and a codeword from the second-level VLC table. Coding efficiency and overall system performance may be improved by limiting the number of possible symbol combinations that are candidates to be mapped to codewords in the first-level VLC table.

In one example, this disclosure provides a method that includes identifying run information for a plurality of symbol combinations of a plurality of digital video block coefficients of a transform block, wherein the run information indicates a number of contiguous zero coefficients; storing data defining a multi-level VLC table, wherein the multi-level VLC table comprises a first-level VLC table and a second-level VLC table, wherein the first-level VLC table maps codewords to symbol combinations; and for a first symbol combination comprising first run information indicating a first number of contiguous zero coefficients is greater than a cut-off-run value, assigning a first codeword to the first symbol combination, wherein the first codeword comprises an escape code from the first-level VLC table.

In another example, this disclosure provides a video coding device for coding video data that includes a variable length code (VLC) table module configured to store data defining a multi-level VLC table, wherein the multi-level table comprises a first-level VLC table and a second-level VLC table, wherein the first-level VLC table maps codewords to symbol combinations; and a VLC coding module configured to assign a first codeword to a first symbol combination, the first symbol combination comprising first run information indicating a first number of contiguous zero coefficients greater than a cut-off-run value, wherein the first codeword comprises an escape code from the first-level VLC table.

In one example, this disclosure provides a video coding apparatus that includes means for identifying run information for a plurality of symbol combinations of a plurality of digital video block coefficients of a transform block, wherein the run information indicates a number of contiguous zero coefficients; means for storing data defining a multi-level VLC table, wherein the multi-level VLC table comprises a first-level VLC table and a second-level VLC table, wherein the first-level VLC table maps codewords to symbol combinations; for a first symbol combination comprising first run information indicating a first number of contiguous zero coefficients is greater than a cut-off-run value, means for assigning a first codeword to the first symbol combination, wherein the first codeword comprises an escape code from the first-level VLC table.

The techniques described in this disclosure may be implemented in hardware, software, firmware, or any combination thereof. If implemented in software, the software may be executed in one or more processors, such as a microprocessor, application specific integrated circuit (ASIC), field programmable gate array (FPGA), or digital signal processor (DSP). The software that executes the techniques may be initially stored in a computer readable medium and loaded and executed in the processor.

Accordingly, this disclosure also contemplates a non-transitory, computer readable storage medium tangibly storing one or more instructions, which when executed by one or more processors cause the one or more processors to: identify run information for a plurality of symbol combinations of a plurality of digital video block coefficients of a transform block, wherein the run information indicates a number of contiguous zero coefficients; store data defining a multi-level VLC table, wherein the multi-level VLC table comprises a first-level VLC table and a second-level VLC table, wherein the first-level VLC table maps codewords to symbol combinations; for a first symbol combination comprising first run information indicating a first number of contiguous zero coefficients is greater than a cut-off-run value, assign a first codeword to the first symbol combination, wherein the first codeword comprises an escape code from the first-level VLC table.

The details of one or more aspects of the techniques described in this disclosure are set forth in the accompanying drawings and the description below. Other features, objects, and advantages of aspects of this disclosure will be apparent from the description and drawings, and from the claims.

BRIEF DESCRIPTION OF DRAWINGS

FIG. 10 shows an example of a transform block.

DETAILED DESCRIPTION

Aspects of this disclosure relate generally to video coding and more particularly to block-based video coding. Prior to being transmitted from a source device to a receiving device, one or more symbol patterns can be generated that represent digital video block coefficients, such as transform coefficients of a video block, and residual video data. The symbol patterns can represent information such as a number representative of the number of contiguous zero coefficients that precede or follow a non-zero coefficient. This number of contiguous zeros is commonly referred to as a run length. Information represented by a symbol pattern may also include whether or not a particular non-zero coefficient has a value of 1 or something other than 1, also referred to as a greater-than-one (GTO), or if a particular coefficient is the last non-zero coefficient in the data block, which is commonly referred to as an end-of-block (EOB). From the symbol patterns, the receiving device can reconstruct the data block using fewer bits of data than if each block coefficient were sent separately and signaled without the use of symbol patterns. To further reduce the number of bits transmitted from the source device to the receiving device the symbol patterns can undergo a form of lossless statistical coding commonly referred to as "entropy coding" prior to being transmitted. Entropy coding utilizes the symbol distribution property of a given data set, in this instance a set of symbol patterns, and in general assigns shorter codewords to symbol patterns that occur more frequently in the data set and longer codewords to symbol patterns that occur less frequently in the data set. Aspects of this disclosure may provide an improved method and system for generating symbol patterns for larger data blocks and for assigning codewords to those symbol patterns.

Symbols, in the context of information theory, refers to a distinct or identifiable pattern of bits. An example symbol may be the bits used to express a character, such as the ASCII code for the letter 'a.' As used in this disclosure a symbol pattern refers generally to a pattern of bits representing one or more symbols, where the one or more symbols represent a piece of information such as a run length, GTO, or an EOB. As used in this disclosure, a symbol combination refers to a pattern of bits representing the information of one or more symbol patterns. Therefore, a symbol combination may, for example, be a pattern of bits representing a run length or an EOB, but a symbol combination may also be a pattern of bits representing both a run length and an EOB or a run length, an EOB, and a GTO.

Figure 1:
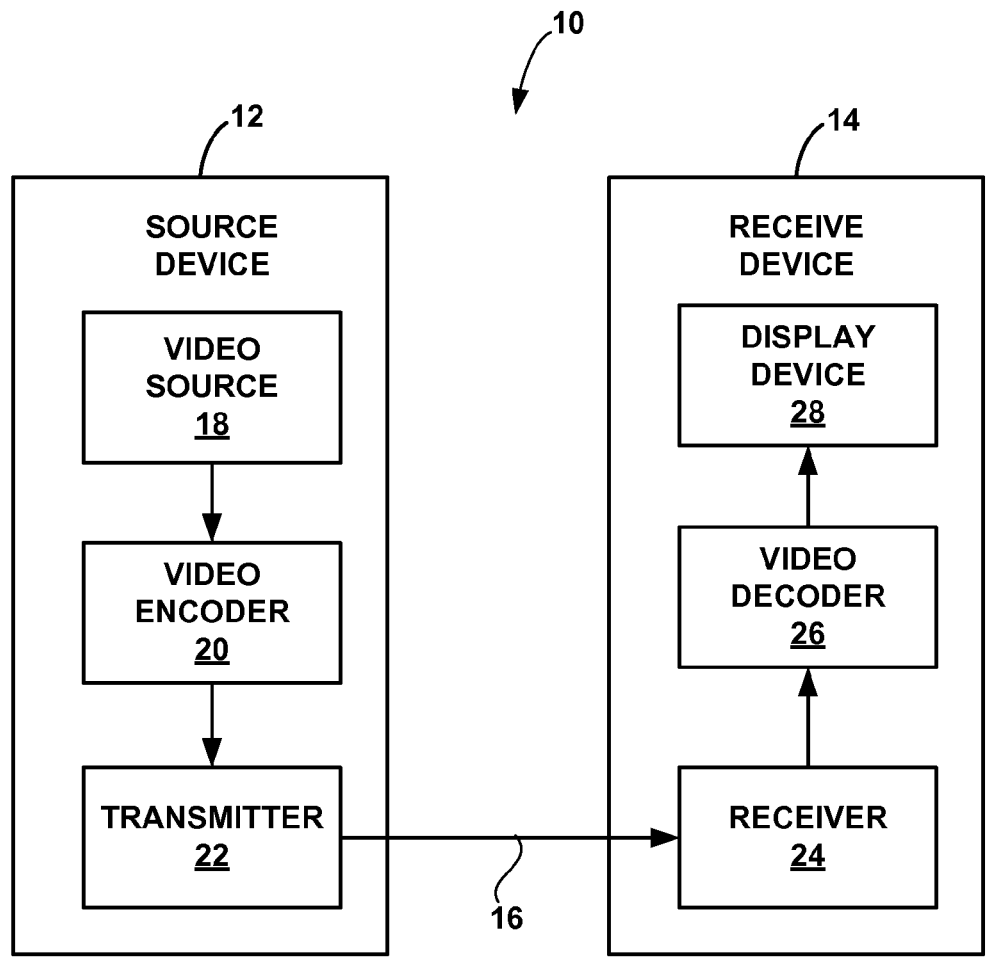
FIG. 1 is a block diagram illustrating a video encoding and decoding system that implements various aspects of this disclosure.

FIG. 1 is a block diagram illustrating a video encoding and decoding system 10 that implements aspects of this disclosure. As shown in FIG. 1, system 10 includes a source device 12 that transmits encoded video data to a receive device 14 via a communication channel 16. Source device 12 may include a video source 18, video encoder 20, and a transmitter 22. Receive device 14 may include a receiver 24, video decoder 26, and video display device 28. System 10 may be configured to implement the various techniques described in this disclosure.

In the example of FIG. 1, communication channel 16 may include any wireless or wired communication medium, such as a radio frequency (RF) spectrum or one or more physical transmission lines, or any combination of wireless and wired media. Channel 16 may form part of a packet-based network, such as a local area network, wide-area network, or a global network such as the Internet. Communication channel 16 generally represents any suitable communication medium, or collection of different communication media, for transmitting video data from source device 12 to receive device 14.

Source device 12 generates video for transmission to receive device 14. In some cases, however, devices 12, 14 may operate in a substantially symmetrical manner. For example, each of devices 12, 14 may include video encoding and decoding components. Hence, system 10 may support one-way or two-way video transmission between video devices 12, 14, e.g., for video streaming, video broadcasting, or video telephony. Accordingly, aspects of this disclosure may be implemented in either source device 12, receive device 14, or both.

Video source 18 may include a video capture device, such as one or more video cameras, a video archive containing previously captured video, or a live video feed from a video content provider. As a further alternative, video source 18 may generate computer graphics-based data as the source video, or a combination of live video and computer-generated video. In some cases, if video source 18 is a camera, source device 12 and receive device 14 may form so-called camera phones or video phones. In each case, the captured, pre-captured, or computer-generated video may be encoded by video encoder 20 for transmission from video source device 12 to video decoder 26 of video receive device 14 via transmitter 22, channel 16 and receiver 24. Display device 28 may include any of a variety of display devices such as a liquid crystal display (LCD), plasma display or organic light emitting diode (OLED) display.

Video encoder 20 and video decoder 26 may be configured to support scalable video coding for spatial, temporal and/or signal-to-noise ratio (SNR) scalability. In some aspects, video encoder 20 and video decoder 26 may be configured to support fine granularity SNR scalability (FGS) coding for SVC. In some examples, video encoder 20 and video decoder 26 may support various degrees of scalability by supporting encoding, transmission, and decoding of a base layer and one or more scalable enhancement layers. For scalable video coding, a base layer carries video data with a minimum level of quality. One or more enhancement layers carry additional bitstream to support higher spatial, temporal and/or SNR levels.

Video encoder 20 and video decoder 26 may operate according to a video compression standard, such as MPEG-2, MPEG-4, ITU-T H.263, or ITU-T H.264/MPEG-4 Advanced Video Coding (AVC). Video encoder 20 and video decoder 26 may also operate according to next generation video coding standards such as ITU-T H.265.

Video encoder 20 and video decoder 26 each may be implemented as one or more microprocessors, digital signal processors (DSPs), application specific integrated circuits (ASICs), field programmable gate arrays (FPGAs), discrete logic, software, hardware, firmware or any combinations thereof. Each of video encoder 20 and video decoder 26 may be included in one or more encoders or decoders, either of which may be integrated as part of a combined encoder/decoder (CODEC) in a respective mobile device, subscriber device, broadcast device, server, or the like. In addition, source device 12 and receive device 14 each may include appropriate modulation, demodulation, frequency conversion, filtering, and amplifier components for transmission and reception of encoded video, as applicable, including radio frequency (RF) wireless components and antennas sufficient to support wireless communication. For ease of illustration, however, such components are not shown in FIG. 1.

A video sequence includes a series of video frames. Video encoder 20 operates on blocks of pixels within individual video frames in order to encode the video data. The video blocks may have fixed or varying sizes, and may differ in size according to a specified coding standard. Each video frame includes a series of slices. Each slice may include a series of macroblocks, which may be arranged into sub-blocks. As an example, the ITU-T H.264 standard supports intra prediction in various block sizes, such as 16 by 16, 8 by 8, 4 by 4 for luma components, and 8 by 8 for chroma components, as well as inter prediction in various block sizes, such as 16 by 16, 16 by 8, 8 by 16, 8 by 8, 8 by 4, 4 by 8 and 4 by 4 for luma components and corresponding scaled sizes for chroma components.

Smaller video blocks can provide better resolution, and may be used for locations of a video frame that include higher levels of detail. In general, macroblocks (MBs) and the various sub-blocks may be considered to be video blocks. In addition, a slice may be considered to be a series of video blocks, such as MBs and/or sub-blocks. Each slice may be an independently decodable unit. After prediction, video encoder 20 applies a transform to the 8 by 8 residual block or 4 by 4 residual block. An additional transform may be applied to the DC coefficients of the 4 by 4 blocks for chroma components or luma component if the intra_16×16 prediction mode is used. Although aspects of this disclosure may be described, for purposes of explanation, at the slice level, the same techniques can also be applied at the picture level.

Generally, video encoder 20 applies a discrete cosine transform (DCT) to the blocks, generating DCT coefficients, also referred to as transform coefficients, or more generally as digital video block coefficients. The DCT generates DCT coefficients that are generally ordered such that the resulting DCT coefficients having non-zero values are grouped together and those having zero values are grouped together. Video encoder 20 then performs a form of serialization that involves scanning the resulting DCT coefficients in accordance with a particular scanning order or pattern. A zig-zag scan is illustrated below with respect to the example of FIG. 9, although different scanning patterns may be employed so as to extract the groups of zero and non-zero DCT coefficients, such as vertical, horizontal or other scanning patterns.

Once extracted, video encoder 20 performs what is commonly referred to as "run-length coding," which typically involves computing a total number of zero DCT coefficients (i.e., the so-called "run") that are contiguous (i.e. adjacent to one another) after being serialized. As will be shown in more detail below with the example of FIGS. 9 and 10, one or more symbol combinations can be generated that describe the serialized DCT coefficients. The symbol combinations can represent information such as run length, GTO, EOB, and other information that can be used by receive device 14 to reconstruct the serialized DCT coefficients. Using the symbol combinations, receive device 14 can reconstruct the serialized DCT coefficients, and ultimately the data block, using fewer bits of data than if each DCT coefficient were sent separately and signaled without the use of symbol combinations.

Next, video encoder 20 performs statistical lossless coding, which is commonly referred to as entropy coding. Entropy coding is a lossless process used to further reduce the number of bits that need to be transmitted from source device 12 to receive device 14 in order for receive device 14 to reconstruct the set of DCT coefficients. Entropy coding utilizes the symbol distribution property of a given set of symbol combinations, and in general, assigns shorter codewords to more frequently occurring symbol combinations and longer codewords to less frequently occurring symbol combinations.

Video encoder 20 and video decoder 26 may, in some dynamic implementations, each include functionality for tracking occurrence probabilities of certain symbol combinations so that for a given context, the most frequently occurring symbol combinations in that context can be mapped to shorter codewords. A symbol occurrence probability may be tracked based on the total number of times a particular symbol combination has occurred or on a weighted total number of times a particular symbol combination has occurred, where a more recently occurring symbol combination is weighted more heavily than a less recently occurring symbol combination. A symbol occurrence probability may also be tracked based on the total number of times, or a weighted total number of times, that a particular symbol combination has occurred within a particular window, such as the T most recent symbol combinations.

The mapping of the symbol combinations to codewords can be stored at video encoder 20 and video decoder 26 in a plurality of VLC tables or any other type of data structure. The mappings stored in the VLC tables may be adaptable so that as tracked occurrence probabilities for symbol combinations change, the mappings of symbol combinations to codewords can also change. If the occurrence probabilities of some symbol combinations becomes more probable or less probable than the occurrence of other symbol combinations, then video encoder 20 and video decoder 26 may, in the dynamic implementations, update the VLC tables by remapping some of the symbol combinations to either longer or shorter codewords based on their occurrence probability. Video encoder 20 and video decoder 26, in these dynamic implementations, can be configured to implement the same data processing techniques so that changes to the VLC tables that occur at video encoder 20 can be reflected at video decoder 26 without data reflecting the changes being sent between source device 12 and receive device 14.

As will be described in more detail below, the H.264/MPEG-4 AVC standard defines a form of entropy coding referred to as context adaptive variable length coding (CAVLC) for coding transform coefficients. CAVLC is specifically designed for 4 by 4 transform sizes but does not always work well for transforms larger than 4 by 4. In particular, transforms larger than 4 by 4 typically have a far greater number of possible symbol combinations to be mapped to a single VLC table. Thus, the number of symbol combinations for which video encoder 20 has to track occurrence probabilities can also be far greater, which may decrease the efficiency of symbol adaptation in dynamic implementations like those mentioned above. As a result of the decreased efficiency of symbol adaptation, overall coding efficiency and overall system performance may also decrease.

Assuming the content statistics for a portion of video are relatively constant, once video encoder 20 and video decoder 26 have processed an adequately large number of symbol combinations, the tracked occurrence probabilities for symbol combinations generally reach relatively stable values. In such a case, the mapping of codewords to symbol combinations maintained in the VLC tables also becomes relatively stable, with video encoder 20 and video decoder 26 only occasionally needing to update the stored VLC tables by remapping symbol combinations to codewords. In the early stages of entropy coding or when there is a significant change to the content statistics for a portion of video, however, the occurrence probabilities for certain symbol combinations stored in the VLC tables may not reflect actual occurrence probabilities for that portion of video, which may cause coding efficiency to suffer. With the larger number of possible symbol combinations associated with transforms larger than 4 by 4, the number of symbol combinations needed to be processed by video encoder 20 before the number of occurrence of symbol combination begins to represent its actual occurrence probability can be significantly greater, thus prolonging these periods of inefficient entropy coding. Aspects of this disclosure may improve the construction and maintenance of VLC tables, and thus improve coding efficiency by reducing the effect these periods of inefficient entropy coding have on overall coding efficiency.

Moreover, because CAVLC is specifically designed for 4 by 4 transform sizes, CAVLC may be unable to meet the demands of encoding high-resolution or so-called high-definition (HD) video data. HD video data often makes use of transforms that are significantly larger than 4 by 4 transforms in order to achieve better coding efficiency. The larger transform sizes result in more potential symbol combinations because the number of possible symbol combinations increases with the size of the data being encoded, which is directly proportional to the size of the transform applied. In this respect, CAVLC would require a much larger table to store all of the possible combinations and their associated codeword. Consequently, in addition to the slow adaptation of VLC codeword mapping discussed above, extending CAVLC to encode this high-resolution or HD video data may also result in significantly more computational resources dedicated to tracking occurrence probabilities and significantly more memory consumption to store these larger tables, which are commonly referred to as "codebooks."

In accordance with aspects of this disclosure, rather than maintaining a single-level VLC table for all possible symbol combinations, video encoder 20 stores data defining one or more multi-level VLC tables and limits the symbol combinations that are candidates for the first level of the multi-level VLC table based on the number of contiguous zero coefficients (i.e. a run length) represented by a particular symbol combination. This first level of the multi-level VLC table may employ general VLC techniques to associate symbol combinations with codewords. The second level of the multi-level VLC table may utilize structured VLC codes, such as Golomb-Rice codes. Due to the second-level VLC table's structured nature, there is no need to store this second level of the multi-level VLC tables, as the Golomb-Rice codes, as one example, may be dynamically determined based on certain parameters known to both the encoder and the decoder. The first level of the multi-level VLC table of this disclosure may be characterized as storing a mapping between symbol combinations and codewords for the most frequently occurring symbol combinations. The second level of the multi-level VLC table described in this disclosure may be characterized as providing a way of dynamically determining, without storing any actual table to memory, codewords for less frequently occurring symbol combinations.

In this regard aspects of this disclosure may improve encoding and decoding efficiency for transform coefficients generated from applying transforms of sizes larger than 4 by 4 while also improving memory consumption by providing a second level of structured codes. Improved coding efficiency may result from applying VLC to transform coefficients resulting from application of transforms of sizes larger than 4 by 4 when conventional CAVLC has not been extended in this manner. Limiting the symbol combinations that are candidates for the first level of the multi-level VLC table based on the number of contiguous zero coefficients represented by a particular symbol combination decreases the total number of symbol combinations for which video encoder 20 needs to track occurrence probabilities, which may cause the probability tracking to adapt more quickly, thus shortening the periods of inefficient entropy coding discussed above. Additionally, the amount of memory consumed by codebooks may also be reduced as a result of relying on a second level of structured codewords that do not require any stored codebook to produce. Improved encoding and decoding efficiency may reduce the number of bits needed to be sent from source device 12 to receive device 14 in order for the video decoder 26 of receive device 14 to reconstruct a set of transform coefficients. Moreover, improved coding and decoding efficiency promote more efficient power utilization, which may be particularly important in the context of battery-driven portable devices, such as handsets or other cellular phones, including so-called "smart phones."

To illustrate these techniques, video encoder 20 may determine, for a plurality of transform coefficients, run information indicating a number of the coefficients that are contiguous and have a value of zero. Video encoder 20 stores data defining a multi-level VLC table, as noted above and described below in more detail. The multi-level VLC table comprises a first-level VLC table and a second-level VLC table. The first-level VLC table maps codewords to symbol combinations in the manner described above. In response to identifying a symbol combination representing a run value greater than a cut-off-run value, video encoder 20 assigns an escape code from the first-level VLC table and a codeword from the second-level VLC table to the symbol combination.

A run value generally refers to the number of contiguous zero coefficients that, depending on the coding scheme being used, either precede or follow a non-zero coefficient. A cut-off-run value generally refers to a threshold value that determines, based on the run value of a particular symbol combination, how the particular symbol combination is to be coded. For example, a cut-off-run value might be set at five. Therefore, symbol combinations indicating that a non-zero coefficient is preceded by, or followed by depending on the coding scheme used, six zero coefficients might be coded as a concatenation of an escape code and a codeword from the second-level VLC table.

When video decoder 26 detects the escape code, it further decodes a codeword from the second-level VLC table. Coding a symbol combination as a concatenation of an escape code and a codeword from a second-level VLC table generally requires more bits than coding a symbol combination as a codeword from a first-level VLC table. Therefore, aspects of this disclosure include coding more frequently occurring symbol combinations as codewords in the first-level VLC table, and coding less frequently occurring symbol combinations as concatenations of an escape code and a codeword from a second-level VLC table.

Figure 2:
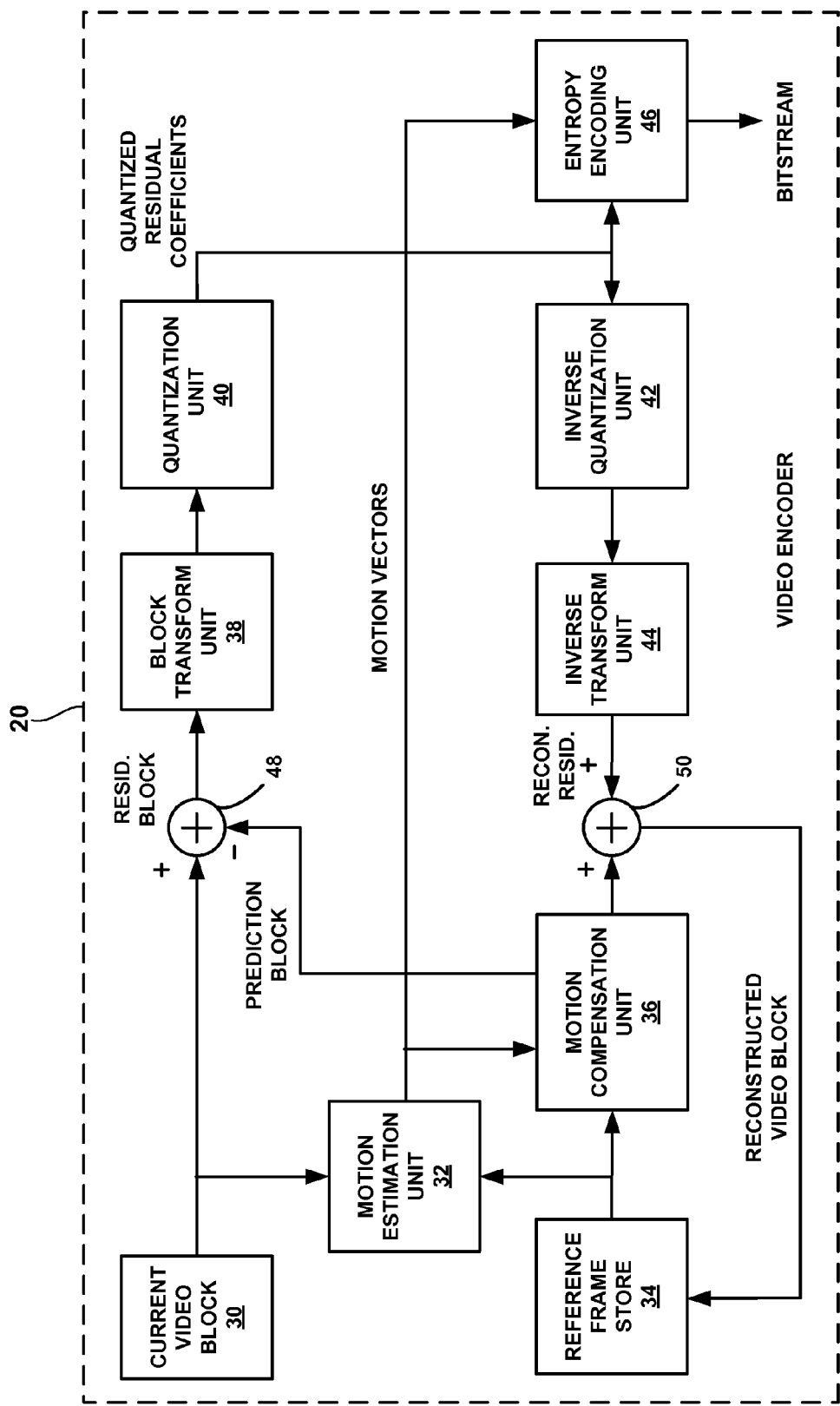
FIG. 2 is a block diagram illustrating an example of the video encoder shown in FIG. 1.

FIG. 2 is a block diagram illustrating an example of a video encoder 20, such as video encoder 20 in FIG. 1. Video encoder 20 may perform intra- and inter-coding of blocks within video frames. Intra-coding relies on spatial prediction to reduce or remove spatial redundancy in video within a given video frame. Inter-coding relies on temporal prediction to reduce or remove temporal redundancy in video within adjacent frames of a video sequence. For inter-coding, video encoder 20 performs motion estimation to track the movement of matching video blocks between adjacent frames.

As shown in FIG. 2, video encoder 20 receives a current video block 30 within a video frame to be encoded. In the example of FIG. 2, video encoder 20 includes motion estimation unit 32, reference frame store 34, motion compensation unit 36, block transform unit 38, quantization unit 40, inverse quantization unit 42, inverse transform unit 44 and entropy coding unit 46. An in-loop deblocking filter (not shown) may be applied to filter blocks to remove blocking artifacts. Video encoder 20 also includes summer 48 and summer 50. FIG. 2 illustrates the temporal prediction components of video encoder 20 for inter-coding of video blocks. Although not shown in FIG. 2 for ease of illustration, video encoder 20 also may include spatial prediction components for intra-coding of some video blocks.

Motion estimation unit 32 compares video block 30 to blocks in one or more adjacent video frames to generate one or more motion vectors. The adjacent frame or frames may be retrieved from reference frame store 34, which may include any type of memory or data storage device to store video blocks reconstructed from previously encoded blocks. Motion estimation may be performed for blocks of variable sizes, e.g., 32 by 32, 32 by 16, 16 by 32, 16 by 16, 16 by 8, 8 by 16, 8 by 8 or smaller block sizes. Motion estimation unit 32 identifies one or more blocks in adjacent frames that most closely matches the current video block 30, e.g., based on a rate distortion model, and determines displacement between the blocks in adjacent frames and the current video block. On this basis, motion estimation unit 32 produces one or more motion vectors (MV) that indicate the magnitude and trajectory of the displacement between current video block 30 and one or more matching blocks from the reference frames used to code current video block 30.

Motion vectors may have half- or quarter-pixel precision, or even finer precision, allowing video encoder 20 to track motion with higher precision than integer pixel locations and obtain a better prediction block. When motion vectors with fractional pixel values are used, interpolation operations are carried out in motion compensation unit 36. Motion estimation unit 32 identifies the best block partitions and motion vector or motion vectors for a video block using certain criteria, such as a rate-distortion model. For example, there may be more than motion vector in the case of bi-directional prediction. Using the resulting block partitions and motion vectors, motion compensation unit 36 forms a prediction video block.

Video encoder 20 forms a residual video block by subtracting the prediction video block produced by motion compensation unit 36 from the original, current video block 30 at summer 48. Block transform unit 38 applies a transform, such as the 4 by 4 or 8 by 8 to the residual block, producing residual transform block coefficients. Quantization unit 40 quantizes the residual transform block coefficients to further reduce bit rate. Entropy coding unit 46 entropy codes the quantized coefficients to even further reduce bit rate.

In accordance with aspects of this disclosure described in more detail below with respect to FIG. 4, entropy encoding unit 46 operates as a variable length coding (VLC) unit to apply VLC coding to the quantized block coefficients. In particular, entropy encoding unit 46 may be configured to perform VLC coding of digital video block coefficients in accordance with the techniques described above in relation to FIG. 1, and below in relation to FIGS. 9, and 10. Entropy coding unit 46 performs a form of lossless statistical coding, and for this reason, entropy coding unit 46 may also be referred to as "lossless statistical coding unit 46." In general, video decoder 26, described in more detail in FIGS. 3 and 5, performs inverse operations, including VLC decoding, to decode and reconstruct the encoded video.

Inverse quantization unit 42 and inverse transform unit 44 apply inverse quantization and inverse transformation, respectively, to reconstruct the residual block. Summer 50 adds the reconstructed residual block to the motion compensated prediction block produced by motion compensation unit 36 to produce a reconstructed video block for storage in reference frame store 34. The reconstructed video block is used by motion estimation unit 32 and motion compensation unit 36 to encode a block in a subsequent video frame.

Figure 3:
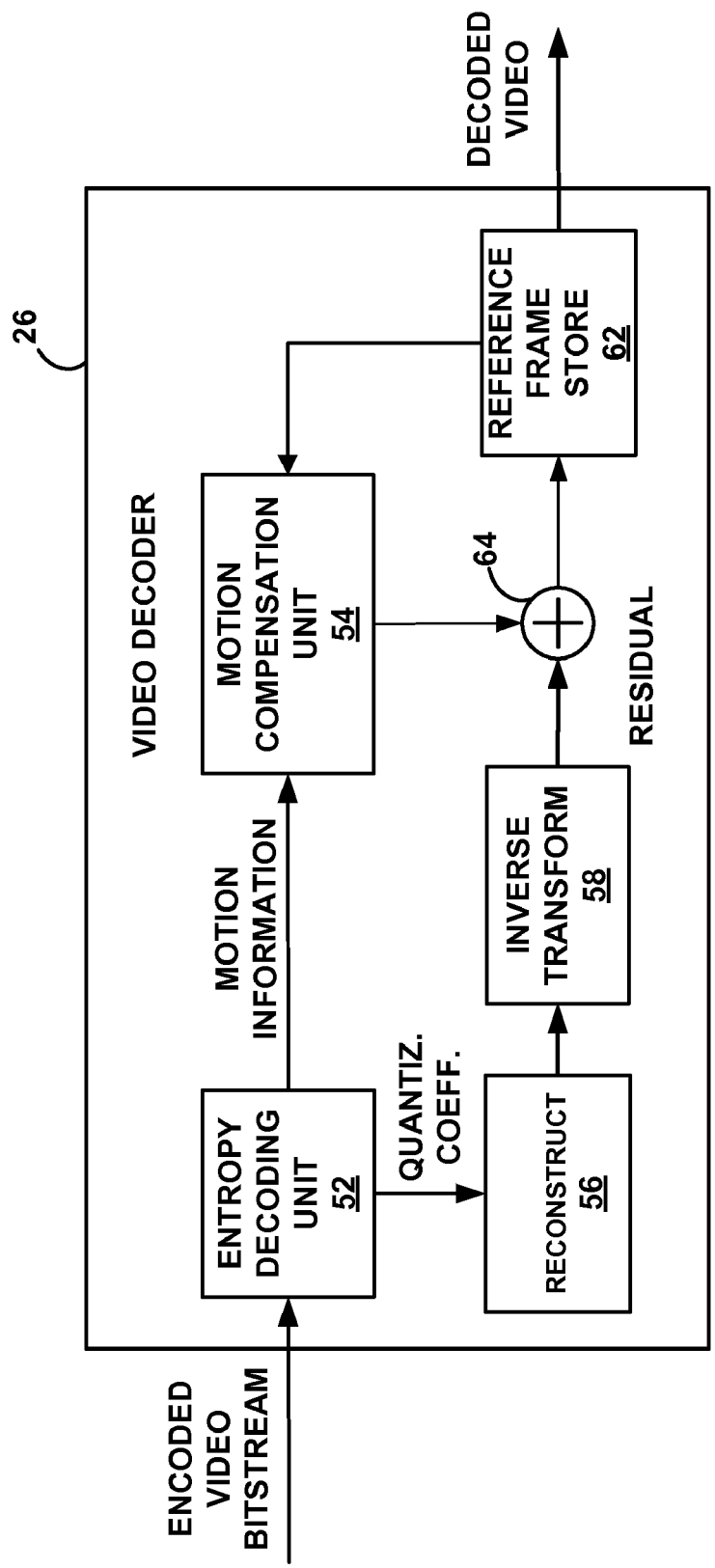
FIG. 3 is a block diagram illustrating an example of the video decoder shown in FIG. 1.

FIG. 3 is a block diagram illustrating an example of a video decoder, such as video decoder 26 of FIG. 1. Video decoder 26 may perform intra- and inter-decoding of blocks within video frames. As shown in FIG. 1, video decoder 26 receives an encoded video bitstream that has been encoded by video encoder 20. In the example of FIG. 3, video decoder 26 includes entropy decoding unit 52, motion compensation unit 54, reconstruction unit 56, inverse transform unit 58, and reference frame store 62. Video decoder 26 also may include an in-loop deblocking filter (not shown) that filters the output of summer 64. Video decoder 26 also includes summer 64. FIG. 3 illustrates the temporal prediction components of video decoder 26 for inter-decoding of video blocks. Although not shown in FIG. 3, video decoder 26 also may include spatial prediction components for intra-decoding of some video blocks.

Entropy decoding unit 52 receives the encoded video bitstream and decodes from the bitstream quantized residual coefficients, macroblock coding mode and motion information, which may include motion vectors and block partitions. Hence, entropy decoding unit 52 functions as a VLC decoding unit. For example, in order to decode quantized residual coefficients from the encoded bitstream, entropy decoding unit 52 of FIG. 3 may be configured to implement aspects of this disclosure described above with respect to FIG. 1 and below with respect to FIGS. 9, and 10. However, entropy decoding unit 52 performs VLC decoding in a substantially inverse manner relative to entropy encoding unit 46 of FIG. 2 in order to retrieve quantized block coefficients from the encoded bitstream.

Motion compensation unit 54 receives the motion vectors and block partitions and one or more reconstructed reference frames from reference frame store 62 to produce a prediction video block. Reconstruction unit 56 inverse quantizes, i.e., de-quantizes, the quantized block coefficients. Inverse transform unit 58 applies an inverse transform, e.g., an inverse DCT or an inverse 4 by 4 or 8 by 8 integer transform, to the coefficients to produce residual blocks. The prediction video blocks are then summed by summer 64 with the residual blocks to form decoded blocks. A deblocking filter (not shown) may be applied to filter the decoded blocks to remove blocking artifacts. The filtered blocks are then placed in reference frame store 62, which provides reference frame for decoding of subsequent video frames and also produces decoded video to drive display device 28 (FIG. 1).

Figure 4:
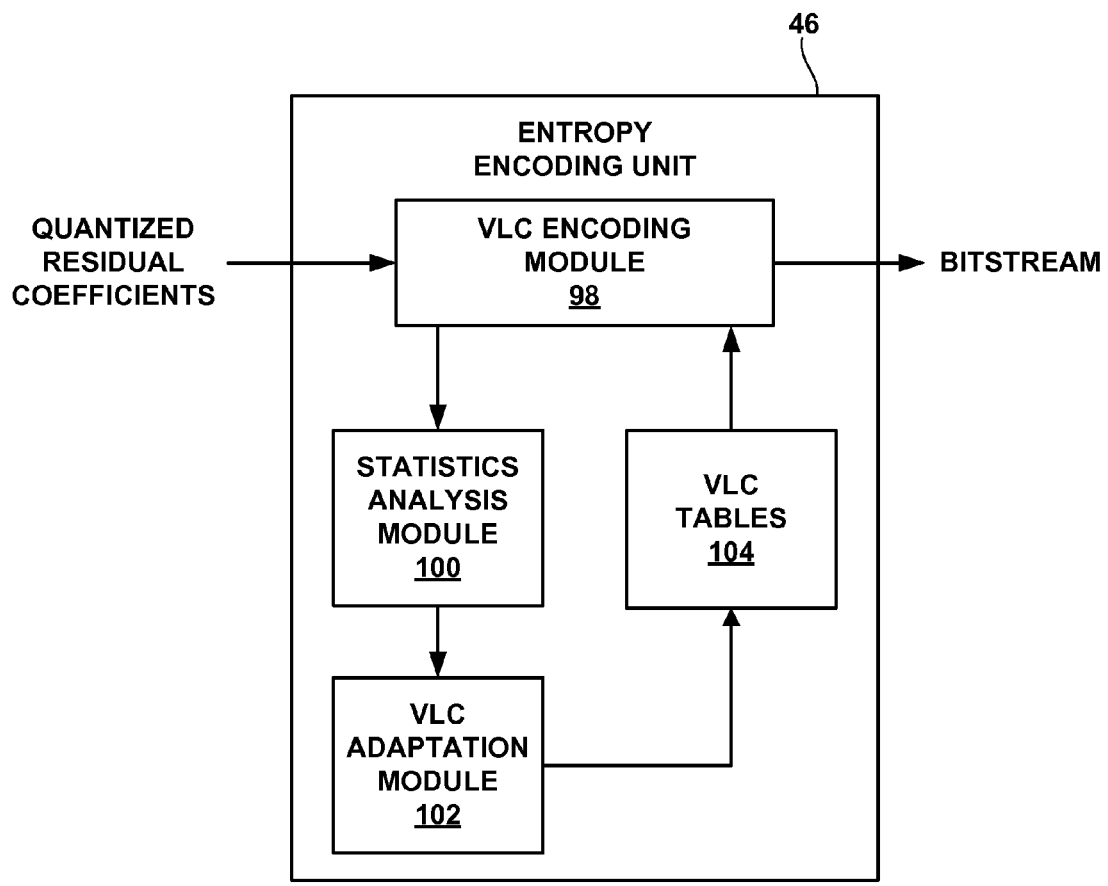
FIG. 4 is a block diagram of an entropy encoding unit configured to implement aspects of this disclosure.

FIG. 4 is a block diagram of entropy encoding unit 46 of FIG. 2 in more detail. Entropy encoding unit 46 may reside within video encoder 20 of FIGS. 1 and 2. As shown in FIG. 2, entropy encoding unit 46 receives quantized residual block coefficients, e.g., from quantization unit 40 (FIG. 2), and generates an entropy coded bitstream for transmission to another device for decoding. In the example of FIG. 4, entropy encoding unit 46 includes VLC encoding module 98, statistics analysis module 100, VLC adaptation module 102 and a VLC tables module 104. VLC tables module 104 stores data defining a multi-level VLC table as described above with respect to FIG. 1 and below with respect to FIGS. 9, and 10. VLC tables module 104 may for example store data defining a first-level VLC table that maps codewords to symbol combinations. VLC tables module 104 may also be configured to dynamically generate a structured code, also referred to throughout this disclosure as a second-level VLC table, that does not need to be stored. Statistics analysis module 100 collects coding statistics for a set of candidate symbol combinations. Statistics analysis module 100 tracks the occurrence probabilities of symbol combinations for a given context, and based on the coding statistics collected by statistics analysis module 100, VLC adaptation module 102 may adjust the mapping between the codewords of the first-level VLC table and a subset of the set of candidate symbol combinations.

Figure 5:
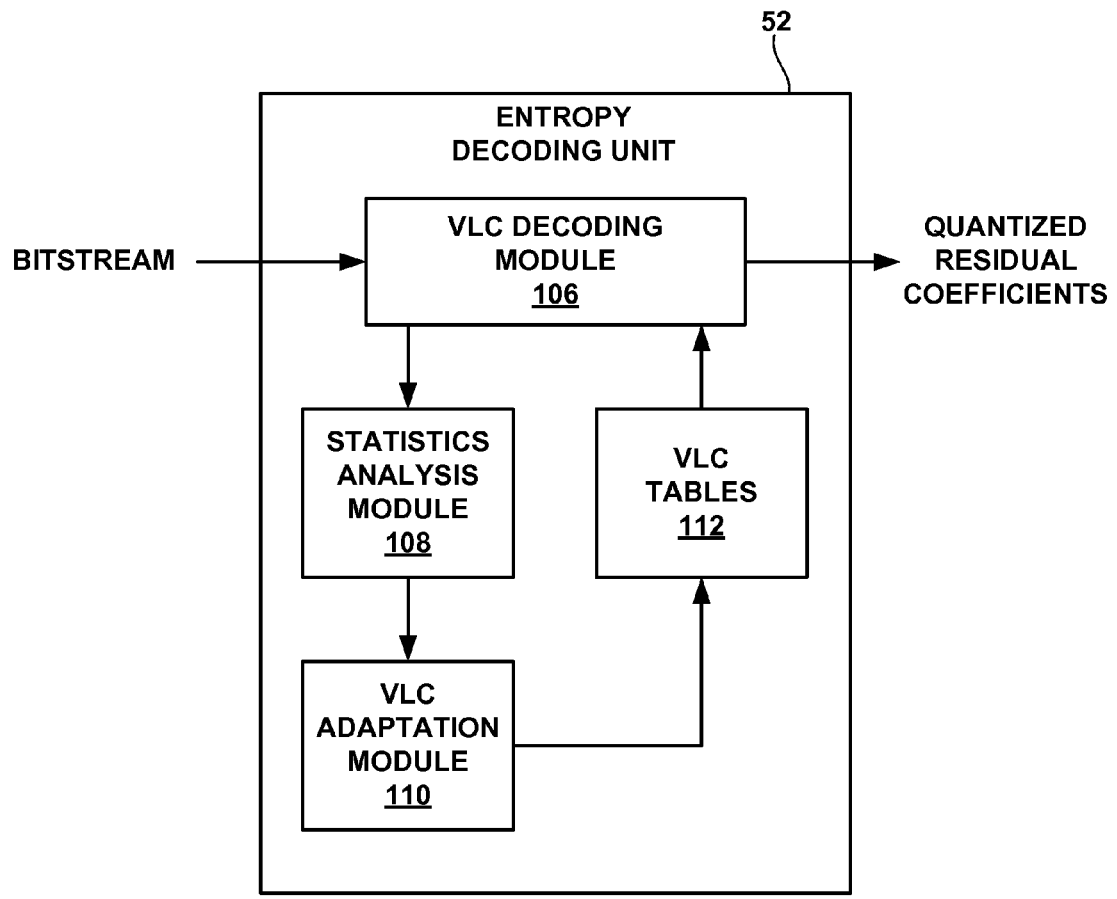
FIG. 5 is a block diagram of an entropy decoding unit configured to implement aspects of this disclosure.

FIG. 5 is a block diagram of an entropy decoding unit 52 configured to implement the various techniques described in this disclosure. As shown above in the examples of FIGS. 1 and 5, entropy decoding unit 52 resides within video decoder 26. While described with respect to this example configuration, entropy decoding unit 52 may reside within any device capable of performing statistical lossless coding. In this respect the techniques should not be limited to the examples described in this disclosure. As shown in FIG. 3, entropy decoding unit 52 receives an encoded video bitstream, e.g., from source device 12 via channel 16 (FIG. 1), and entropy decodes the bitstream to produce quantized residual coefficients.

In the example of FIG. 5, entropy decoding unit 52 includes VLC decoding module 106, statistics analysis module 108, VLC adaptation module 110, and a VLC tables module 112. VLC tables module 112 may for example store data defining a first-level VLC table that maps codewords to symbol combinations. VLC tables module 112 may also be configured to dynamically decode a structured code, also referred to throughout this disclosure as a second-level VLC table, that does not need to be stored. The first-level and second-level VLC tables maintained by VLC tables module 112 match the VLC tables maintained by VLC tables modules 104 so that codewords assigned at video encoder 20 can be decoded at video decoder 26. Statistics analysis module 108 tracks the occurrence probabilities of symbol combinations for a given context, and if the occurrence of a particular symbol combination becomes more or less probable, VLC adaptation module 110 remaps the particular symbol combination to either a shorter or longer codeword in the VLC tables maintained by VLC tables module 112.

Entropy coding is a lossless process used to further reduce the number of bits required to represent a given data set. Entropy coding utilizes the symbol distribution property of the given data set and in general assigns shorter codewords to more frequently occurring members of the data set. In the present example, the given data set is a set of possible symbol combinations, and shorter codewords are generally assigned to the particular symbol combinations that occur most frequently. Statistics analysis module 100 of entropy encoding unit 46 and statistics analysis module 108 of entropy decoding unit 52 can track and maintain the occurrence probabilities of particular symbol combinations so that for a given context, the most frequently occurring symbol combinations in that context map to shorter codewords. If the occurrence of some symbol combinations becomes more probable or less probable than the occurrence of other symbol combinations, then VLC adaptation module 102 of entropy encoding unit 46 updates the VLC tables maintained by VLC tables module 104, and VLC adaptation module 110 of entropy decoding unit 52 updates the VLC tables maintained by VLC tables module 112 by remapping some symbol combinations to either longer or shorter codewords based on their occurrence probability. Statistics analysis module 100 and VLC adaptation module 102 can be configured to implement the same data processing techniques as statistics analysis module 108 and VLC adaptation module 110. Thus, changes to the VLC tables maintained by VLC tables module 104 that occur at the entropy encoding unit 46 can be reflected at the VLC tables maintained by VLC tables module 112 at entropy decoding unit 52 without data reflecting the changes being sent between entropy encoding unit 46 and entropy decoding unit 52.

Prior to entropy coding, transform coefficients from a block are re-arranged into an ordered one-dimensional array based on a scanning order used by the entropy encoding unit 46. As will be shown in more detail below with reference to the example of FIGS. 9 and 10, the transform coefficients can be described using one or more symbol combinations. VLC encoding module 98 of entropy encoding unit 46 codes the symbol combinations in a particular form, and entropy decoding unit 52 decodes the coded data to reproduce the symbol combinations and ultimately to reproduce the transform block. VLC tables, such as the VLC tables maintained by VLC tables modules 104, 112, are stored at both entropy encoding unit 46 of video encoder 20 and entropy decoding unit 52 of video decoder 26, with each codeword from a VLC table representing a certain symbol combination in a certain context.

In order to cover all possible symbol combinations for a transform larger than 4 by 4, a large number of codewords may be needed for the VLC tables maintained by VLC tables modules 104, 112. A larger size VLC table, however, requires more memory to save the codewords. To alleviate such a requirement, aspects of this disclosure include VLC tables modules 104, 112 maintaining VLC tables with two or more levels. In a two-level table, for example, the first level might consist of a number of variable length codes, among which one variable length code represents an escape code. The second level might consists of a group of structured VLC codes, such as Golomb-Rice code. Due to its structured nature, the second-level VLC codes can be dynamically determined on-the-fly at both entropy encoding unit 46 and entropy decoding unit 52, and thus do not need to be stored.

With a two-level VLC table, only a subset of possible symbol combinations are mapped to a variable length code in a first-level VLC table. Entropy encoding unit 46 codes the rest of the symbol combinations as a concatenation of an escape code from the first-level VLC table and a codeword from a second-level VLC table.

The number of possible symbol combinations may be larger than the number of variable length codes in the first-level VLC table. In this case, all of the possible symbol combinations can be candidate symbol combinations to be mapped to a variable length code in the first-level VLC table. Based on the occurrence probability under a certain context, entropy encoding unit 46 might map only the candidate symbol combinations with the highest occurrence probabilities to a codeword in the first-level VLC table. Entropy encoding unit 46 can code the rest of the candidate combinations as a concatenation of an escape code from the first-level VLC table and a codeword from a second-level VLC table.

For example, if N represents the number of possible symbol combinations and M represents the number of variable length code entries in the first-level VLC table and the value of N is larger than M, then the N symbol combinations might all be candidate symbol combinations. Which of the N candidate symbol combinations are mapped to a variable length code in the first-level VLC table can be determined based on each candidate symbol combination's occurrence probability. Entropy encoding unit 46 maps only (M−1) symbol combinations of the N possible combinations to a variable length code in the first-level VLC table and codes the remaining (N−M+1) symbol combinations as a concatenation of an escape code from the first-level VLC table and a codeword from a second-level VLC table.

Aspects of the present disclosure may improve coding efficiency by reducing the total number of symbol combinations that are candidates to be mapped to codewords in the first-level VLC table. As discussed above, the mapping of codewords to symbol combinations can often times be sub-optimal during the early stages of video coding or when the content of video being coded undergoes a change that causes a portion of the video to have content statistics significantly different than previously coded portions. Limiting candidate combinations for a first-level VLC table based on a single cut-off-run value or multiple cut-off-run values, may improve coding and decoding efficiency, especially for transform blocks larger than 4 by 4, by causing the VLC tables maintained by VLC tables modules 104, 112 to track more quickly the changing occurrence probabilities of symbol combinations that occur during the early stages of coding and when content statistics change.

Additionally, aspects of this disclosure may improve coding efficiency by limiting the number of symbol combinations for which statistics analysis module 100 and statistics analysis module 108 need to track occurrence probabilities. For example, a transform block larger than 4 by 4 might have several thousand or even over ten thousand possible symbol combinations. Aspects of this disclosure include identifying a subset of the total possible symbol combinations likely to contain the most frequently occurring symbol combinations. Statistics analysis module 100 and statistics analysis module 108 can then only track the occurrence probabilities for the subset of possible symbol combinations instead of for all possible symbol combinations, thus reducing the amount of processing resources that need to be dedicated to statistics analysis module 100 and statistics analysis module 108. Even if some frequently occurring symbol combinations are excluded from the subset of possible symbol combinations, the reduction in processing resources utilized by statistics analysis module 100 and statistics analysis module 108 may still be a net-positive in overall system performance.

For better coding efficiency, VLC tables modules 104 and VLC tables module 112 can maintain a plurality of VLC tables based on a number of factors, so that for a given circumstance (or context), a different VLC table can be used so that codeword length can better match the symbol distribution property for that given circumstance.

Figure 6:
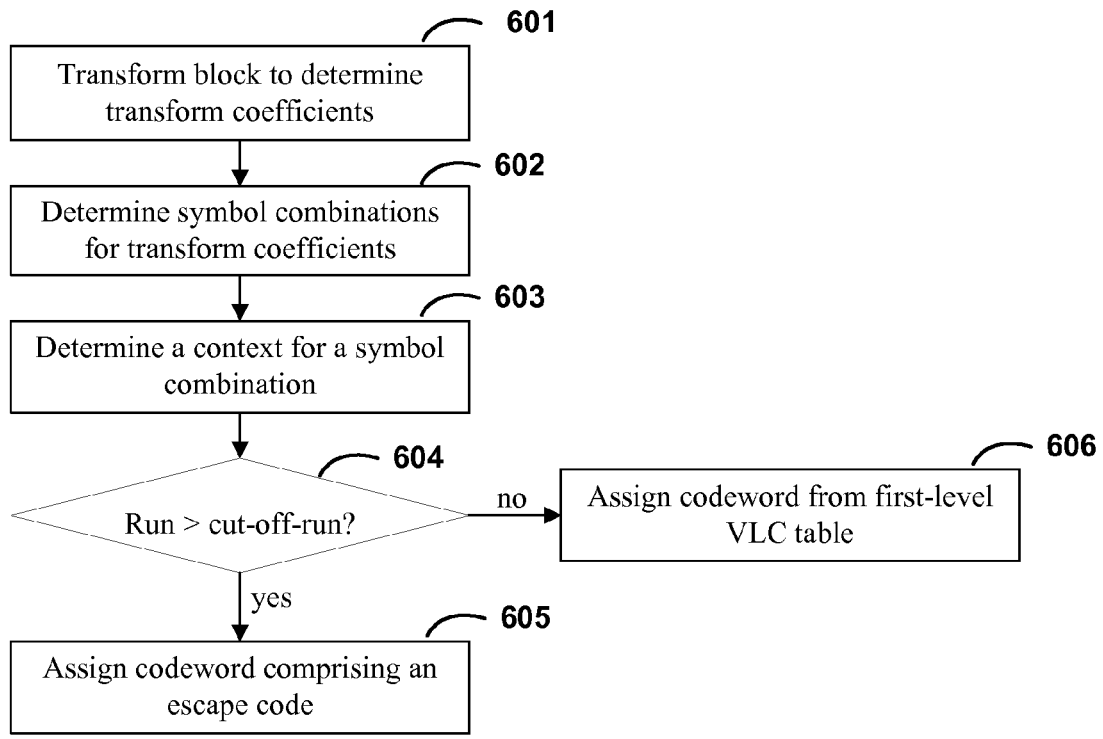
FIG. 6 shows a flowchart illustrating coding techniques described in this disclosure.

FIG. 6 is a flowchart showing a video encoding method embodying aspects of this disclosure. These aspects may, for example, be performed by the devices shown in FIGS. 1-5 and will be described in relation to the devices shown in FIGS. 1-5. At an encoder of a video encoding device, such as video encoder 20 of source device 12, frames of video data can be encoded and transmitted to a video decoding device, such as receive device 14. Video encoder 20 partitions frames of video data into prediction blocks and transforms and quantizes the prediction blocks (block 601). Video encoder 20 determines a set of one or more symbol combinations to represent the transform coefficients of the transform block (block 602). Each symbol combination can be indicative of run, GTO, and/or EOB information for a portion of the transform coefficients of the transform block. For different sizes of transform blocks, video encoder 20 stores data defining one or more multi-level VLC tables, such as the VLC tables maintained by VLC tables module 104 at entropy encoding unit 46. For a symbol combination to be coded, video encoder 20 identifies a particular VLC table maintained by VLC tables module 104 based on the size of the transform block as well as a context associated with the symbol combination to be coded (block 603). Video encoder 20 may, for example, determine a context based on a position index of a first zero coefficient of a run of zeros associated with the symbol combination, a previously coded run and level values for the transform block, or a context may be signaled in a slice header.

In response to identifying a symbol combination indicating run information indicative of a run greater than a cut-off-run value (block 604, yes path), video encoder 20 assigns the symbol combination a codeword comprising a concatenation of an escape code from a first-level VLC table and a codeword of a second-level VLC table (block 605). The second-level VLC table may, for example, include a structured VLC code such as a Golomb-Rice code. The cut-off-run value for a particular transform block can be determined based on the size of the transform block. For example, the cut-off-run value when coding a symbol combination of an 8 by 8 transform block might be different than the cut-off-run value when coding a symbol combination of a 16 by 16 transform block or an 8 by 16 transform block.

In response to identifying a symbol combination indicating run information indicative of a run less than or equal to a cut-off-run value (block 603, no path), video encoder 20 assigns the symbol combination a codeword from a first-level VLC table (block 606). In some implementations, the codeword from the first-level VLC table might contain run, GTO, and EOB information if the symbol combination includes run information indicative of a run that is also less than or equal to a second cut-off-run value, but the codeword from the first-level VLC table might include only run information or only run and partial GTO and EOB information if the symbol combination contains run information indicative of a run greater than the second cut-off-run value.

Figure 7:
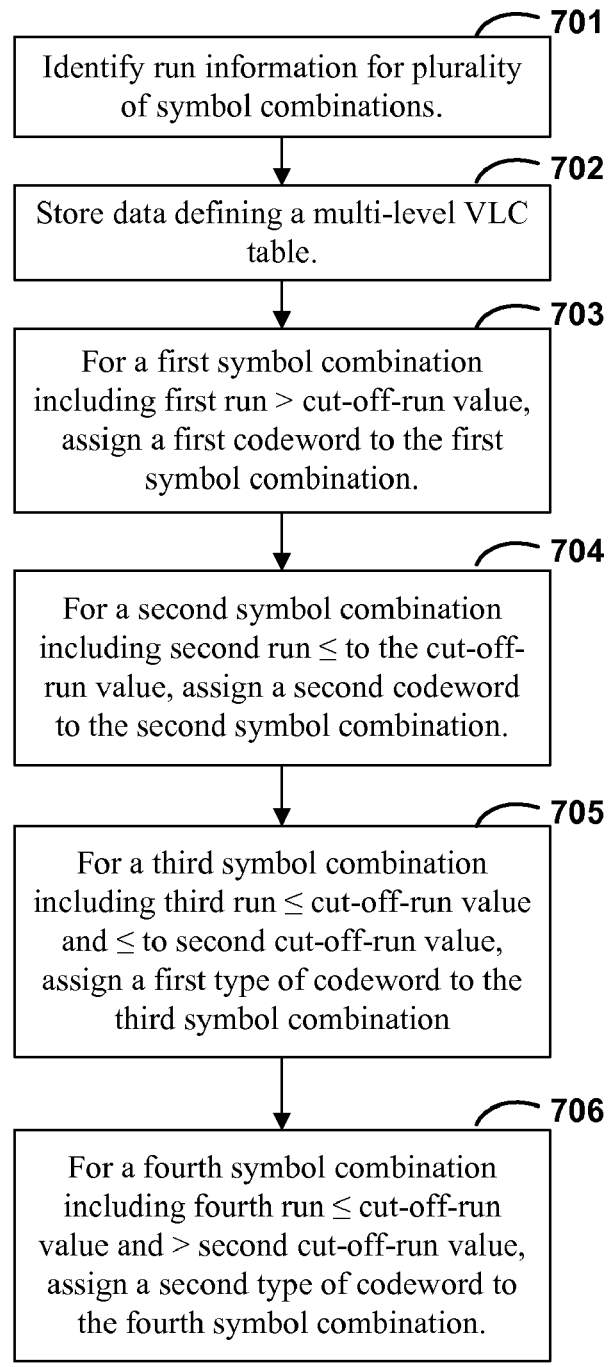
FIG. 7 shows a flowchart illustrating coding techniques described in this disclosure.

FIG. 7 is a flowchart showing a video encoding method embodying techniques described in this disclosure. The techniques may, for example, be performed by the devices shown in FIGS. 1-5 and will be described in relation to the devices shown in FIGS. 1-5. The techniques shown in FIG. 7 can be implemented either in conjunction with the techniques of FIG. 6 and FIG. 8, or independently. At an encoder of a video encoding device, such as video encoder 20 of source device 12, a plurality of symbol combinations can be determined to represent a plurality of digital video block coefficients of a transform block. VLC encoding module 98 identifies run information for the plurality of symbol combinations (block 701). The run information indicates a number of contiguous zero coefficients that, depending on the coding scheme used, either precede or follow a non-zero coefficient. During the coding process, entropy encoding unit 46 stores data defining a multi-level VLC table (block 702). The multi-level VLC tables include a first-level VLC table and a second-level VLC table. The first-level VLC table maps codewords to symbol combinations.

For a first symbol combination including first run information indicating a first number of contiguous zero coefficients is greater than a cut-off-run value, VLC encoding module 98 assigns a first codeword to the first symbol combination (block 703). The first codeword includes an escape code from the first-level VLC table. For a second symbol combination including second run information indicating a second number of contiguous zero coefficients is less than or equal to the cut-off-run value, VLC encoding module 98 assigns a second codeword to the second symbol combination (block 704). The second codeword is from the first-level VLC table. For a third symbol combination comprising third run information indicating a third number of contiguous zero coefficients is less than or equal to the cut-off-run value and less than or equal to a second cut-off-run value, assigning a first type of codeword to the third symbol combination (block 705). The first type of codeword includes greater-than-one information, end-of-block information, and the third run information. For a fourth symbol combination comprising fourth run information indicating a fourth number of contiguous zero coefficients is less than or equal to the cut-off-run value and greater than the second cut-off-run value, assigning a second type of codeword to the fourth symbol combination (block 706). The second type of codeword includes the fourth run information, and may or may not include the greater-than-one and end-of-block information.

Figure 8:
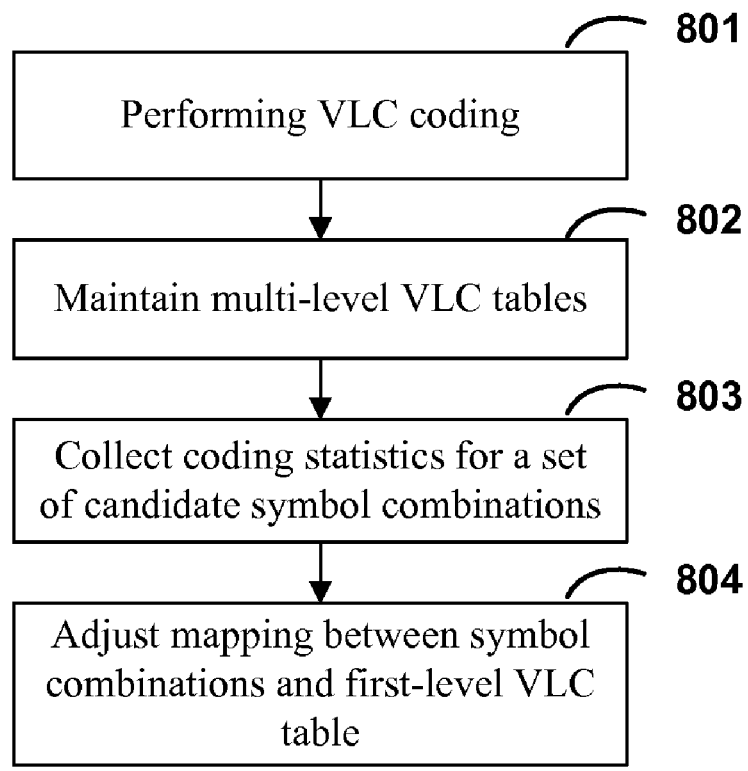
FIG. 8 shows a flowchart illustrating coding techniques described in this disclosure.

FIG. 8 is a flowchart showing a video encoding method embodying techniques described in this disclosure. The techniques may, for example, be performed by the devices shown in FIGS. 1-5 and will be described in relation to the devices shown in FIGS. 1-5. The techniques shown in FIG. 8 can be implemented either in conjunction with the techniques of FIG. 7 and FIG. 8, or independently. While performing VLC coding (block 801), such as the VLC coding methods described in relation to FIGS. 6 an 7, entropy encoding unit 46 of video encoder 20 can store data defining a plurality of multi-level VLC tables (block 802). The multi-level VLC tables can include first-level VLC tables that map symbol combinations to codewords. Statistics analysis module 100 maintains statistics relating to the occurrence probability of a set of candidate symbol combinations (block 803), and based on the collected statistics, VLC adaptation module 102 adjusts the mapping of codewords to symbol combinations in the first-level VLC table (block 804). As described in more detail above, and below with regard to the example of FIGS. 9 and 10, entropy encoding unit 46 can limit the set of candidate symbol combinations based on a single cut-off-run value or multiple cut-off-run values. Aspects of the techniques described in relation to FIG. 8 may also be concurrently performed at receive device 14 by statistics analysis module 108 and VLC adaptation module 110 of entropy decoding unit 52 so that changes to the mapping of symbol combinations and codewords at the VLC tables maintained by VLC tables module 104 are concurrently performed to the VLC tables maintained by VLC tables modules 112 without data describing the changes, or only limited data describing the changes, being transferred from source device 12 to receive device 14.

Figure 10:
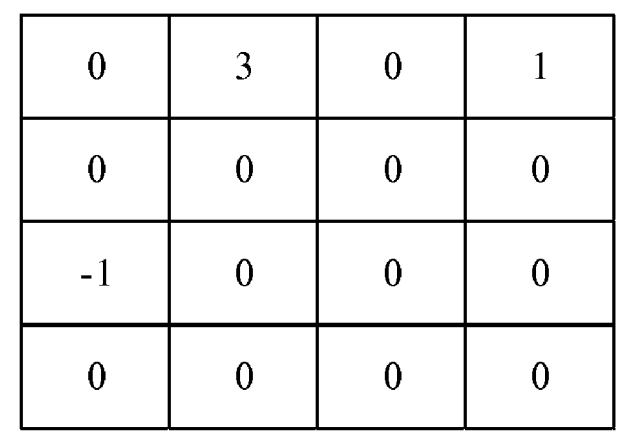

FIG. 10 shows a 4 by 4 transform block, with the numbers in each square representing transform coefficients. Functionality of the various modules and units in FIGS. 1-5 will now be described with regards to the example 4 by 4 transform block of FIG. 10. According to the scanning order shown in FIG. 9, a one-dimensional array of transform coefficients for the transform block of FIG. 10 would be generated by video encoder 20 as follows: [0, 3, 0, −1, 0, 0, 1, 0, 0, 0, 0, 0, 0, 0, 0, 0]. For ease of explanation, the present example uses a 4 by 4 transform block, but aspects of this disclosure may be applicable to and may be particularly advantageous for transform blocks larger than 4 by 4. Furthermore, although for purposes of explanation the present example refers to transform coefficients, aspects of this disclosure may also be applicable to other types of video block data such as residual data.

As with the example transform block of FIG. 10, transform blocks frequently contain a large number of zero coefficients. As a result, the number of contiguous zeros preceding each non-zero coefficient, which is also called a "run" or "run length," is often used in conveying the location information of a non-zero coefficient in a block. The absolute amplitude of a quantized non-zero coefficient is called its "level." Usually the end of the ordered coefficient array contains a significant number of consecutive transform coefficients with a value of zero. Instead of coding those zeros explicitly, entropy encoding unit 46 of video encoder 20 may code an end-of-block (EOB) symbol pattern to signal that the remaining transform coefficients in a transform block are all zeros. Alternatively, entropy encoding unit 46 may code the number of non-zero transform coefficients so that the remaining transform coefficients after the number of non-zero transform coefficients have been received can all be assumed to be zero.

H.264/MPEG-4 AVC defines a context adaptive variable length coding (CAVLC) scheme for coding transform coefficients. The CAVLC mainly includes coding the following information with variable length codes:
1. the number of non-zero coefficients and trailing ones (i.e. coefficients with an amplitude of either 1 or −1) in a block.
2. the sign of each trailing one.
3. the levels of remaining non-zero coefficients.
4. the total number of zeros before the last coefficient.
5. each run of zeros.

When coding the information above, the length of a codeword is determined adaptively based on other information available at the time. This is commonly referred to as context adaptive VLC (CAVLC). This coding scheme is specifically designed and therefore works well for 4 by 4 transform blocks with 16 transform coefficients. However, the scheme is not easily extended to larger size transform blocks without incurring a significant loss of coding efficiency. With the recent focus of video coding on high resolution content, larger sizes of prediction blocks as well as transforms are found to be helpful in improving coding efficiency. As a result, the H.264/MPEG-4 AVC CAVLC techniques may not be flexible enough to provide competitive coding performance in those cases.

Aspects of the present disclosure may be advantageous over the CAVLC in H.264/MPEG-4 standard because, for among other reasons, aspects of the present disclosure may be adapted to transform blocks larger than 4 by 4. For example, aspects of the present disclosure may produce improved coding efficiency for 8 by 8, 16 by 16, 32 by 32, 8 by 16, 16 by 32, and various other sizes of transform blocks. A 16 by 16 transform block, for example, has 256 transform coefficients compared to the 16 transform coefficients of a 4 by 4 block, thus potentially making the H.264/MPEG-4 CAVLC techniques inefficient for larger block sizes. According to aspects of this disclosure, video encoder 20 jointly codes run, level and EOB information of a coefficient array from a transform block using variable length codes prior to source device 12 transmitting the data to receive device 14. Each variable length code represents a certain status of run, level, and EOB information. More specifically, for each non-zero coefficient, a variable length codeword represents some or all of the following information:
  a) run: the number of contiguous zeros preceding the coefficient
  b) greater-than-one (GTO): indicates if the level of the non-zero coefficient is greater than 1
  c) end of block (EOB): indicates if the non-zero coefficient being coded is the last non-zero coefficient in the one-dimensional coefficient array.

Figure 9:
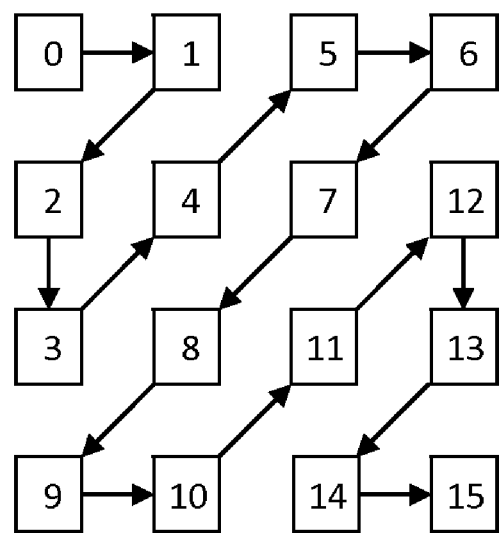
FIG. 9 shows an example of a zig-zag scanning scheme.

Using the transform block of FIG. 10 and the scanning order of FIG. 9 as an example, and if the coding order of the coefficients is the same as the scanning order (i.e., left to right in the one-dimensional array), the symbol combinations to be coded by video encoder 20 and transmitted to receive device 14 are as follows, in a form of (run, GTO, EOB): (1, 1, 0), (1, 0, 0), (2, 0, 1), for the one-dimensional zig-zag scanned array [0, 3, 0, −1, 0, 0, 1, 0, 0, 0, 0, 0, 0, 0, 0].

The first symbol combination (1, 1, 0) in this example contains a run value of 1, signifying that there is one zero to the left of the first non-zero coefficient. The first symbol combination contains a GTO value of 1, indicating that the non-zero coefficient has a value greater than one, which in this instance equals 3. The first symbol combination contains an EOB value of 0, indicating that the first symbol combination does not contain the last non-zero coefficient of the one-dimensional array. Based on the first symbol combination, entropy decoding unit 52 of video decoder 26 can reconstruct the [0, 3, . . . ] portion of the one-dimensional array.

The second symbol combination (1, 0, 0) contains a run value of 1, indicating there is one zero to the left of the next non-zero transform coefficient (in this example, −1). The second symbol combination contains a GTO value of 0, indicating the non-zero transform coefficient does not have a value greater than one, and the second symbol combination contains an EOB value of 0, indicating the second symbol combination does not contain the last non-zero coefficient of the one-dimensional array. Based on the second symbol combination, entropy decoding unit 52 can reconstruct the [ . . . 0, −1, . . . ] portion of the one-dimensional array.

The third symbol combination (2, 0, 1) contains a run value of 2, indicating that there are two zeros to the left of the non-zero transform coefficient, in this instance a 1. The third symbol combination contains a GTO value of 0, indicating the non-zero transform coefficient is a 1, and an EOB value of 1, indicating the non-zero transform coefficient is the last non-zero transform coefficient in the one-dimensional array. Based on the third symbol combination, entropy decoding unit 52 can reconstruct the [ . . . 0, 0, 1, 0, 0, 0, 0, 0, 0, 0, 0, 0] portion of the array, and thus based on all three symbol combinations, the entire one-dimensional array can be reconstructed. By knowing the scanning order used at video encoder 20, video decoder 26 can reconstruct the transform block with the same order.

Video encoder 20 and video decoder 26 can simultaneously construct and manage VLC tables, with each codeword from the VLC table representing a certain status of (run, GTO, EOB). For the example in FIG. 10, for instance, three codewords, one for each of the three symbol combinations, are enough to convey all the information mentioned above from source device 12 to receive device 14.

Alternatively, the coding of the coefficients may also be performed in a reverse scanning order. In such an instance, the symbol combinations to be coded are as follows, in a form of (run, GTO, EOB): (2, 0, 0), (1, 0, 0), (1, 1, 1). In this reverse-scanning order example, the first symbol combination (2, 0, 0) has a run value of 2, signifying there are two zero coefficients to the left of the first non-zero coefficient, in this instance first moving in a direction of right to left in the one-dimensional array. The first symbol combination has a GTO value of 0 indicating the non-zero transform coefficient has a value of 1, and an EOB value of 0 indicating the non-zero coefficient is not the last non-zero coefficient in the one-dimensional array. Based on the first codeword, entropy decoding unit 52 can reconstruct the [ . . . 0, 0, 1 . . . ] portion of the one-dimensional array.

The second symbol combination (1, 0, 0) has a run value of 1, indicating there is one zero to the left of the next non-zero coefficient, in this case a −1. The second symbol combination has a GTO value of 0, signifying the non-zero transform coefficient has a level that is not greater one, and the second symbol combination has an EOB value of 0, indicating the non-zero transform coefficient is not the last non-zero transform coefficient in the one-dimensional array. Based on the second codeword, entropy decoding unit 52 can reconstruct the [ . . . 0, −1 . . . ] portion of the one-dimensional array.

The third symbol combination (1, 1, 1) has a run value of 1, indicating there is one zero to the left of the next non-zero coefficient. The third symbol combination has a GTO value of 1, indicating the non-zero transform coefficient has a level greater than one, and the third symbol combination has an EOB value of 1, indicating the non-zero transform coefficient is the last non-zero transform coefficient in the one dimensional array. Based on the third symbol combination, entropy decoding unit 52 can reconstruct [0, 3, . . . ] portion of the one-dimensional array. By knowing the scanning order used at video encoder 20, video decoder 26 can reconstruct the transform block.

Although the example above presents a single symbol combination that represent a certain status of (run, GTO, EOB), a symbol combination may include any combination of run, GTO, and EOB information. For example, a certain status of (run, GTO, EOB) may be represented by a first symbol combination representing run information and a second symbol combination representing GTO and EOB information. The first and second symbol combinations can be entropy coded and transmitted separately. In another example, a symbol combination may represent run information and either GTO or EOB information, or as explained later, may contain run information with partial GTO and EOB information.

In addition to the information above, for those coefficients whose level is greater than 1, source device 12 can separately code the value of that level and transmit the value to receive device 14. Additionally, source device 12 can code the sign of each non-zero coefficient using 1 bit and transmit the sign to receive device 14. Due to a larger number of non-zero transform coefficients being equal to 1, this technique may further improve coding efficiency by reducing the number of bits needed to transfer level information for the non-zero transform coefficients.

In order to cover all possible symbol combinations for run, GTO, and/or EOB for a given size of transform block, a large number of codewords may be needed for the VLC tables at video encoder 20 and video decoder 26, especially when the transform size is large. Larger size VLC tables, however, require more memory to save the codewords. To alleviate such a requirement, aspects of this disclosure include using VLC tables including two or more levels. In a two-level VLC table, for example, the first-level table might include a number of variable length codes, among which one variable length code represents an escape code. The second-level table might include a group of structured VLC codes, such as Golomb-Rice code. Due to its structured nature, there is no need to save the second-level VLC codes because the second-level VLC codes can be generated dynamically at both video encoder 20 and video decoder 26 by VLC tables module 104 and VLC tables module 112, respectively. The escape code informs video decoder 26 to decode a particular codeword using the second-level VLC table as opposed to the first-level VLC table.

With a two-level VLC table, as described in this disclosure, only a subset of symbol combinations of run, GTO, and/or EOB are mapped to a variable length code in the first-level VLC table. Video encoder 20 codes the rest of the symbol combinations as a concatenation of an escape code from the first-level VLC table and a codeword from a second-level VLC table. Upon detecting the escape code, video decoder 26 decodes the codeword using the second-level VLC table.

The number of possible symbol combinations for run, GTO, and/or EOB may be larger than the number of variable length codes in the first-level VLC table. In such a case, all of the possible symbol combinations can be candidate symbol combinations to be mapped to a variable length code in the first-level VLC table. Based on the occurrence probability under a certain context, only the candidate symbol combinations that occur most often might respectively be mapped to a variable length code in the first-level VLC table. The rest of the candidate symbol combinations can be coded as a concatenation of an escape code from the first-level VLC table and a codeword from a second-level VLC table.

For example, if N represents the number of possible symbol combinations and M represents the number of variable length code entries in the first-level VLC table and the value of N is larger than M, then the N symbol combinations might all be candidate symbol combinations. Which of the N candidate symbol combinations are mapped to a variable length code in the first-level VLC table can be determined based on each candidate symbol combination's occurrence probability. Eventually, only (M−1) symbol combinations for run, GTO, and/or EOB of the N possible combinations are mapped to a variable length code in the first-level VLC table. Video encoder 20 codes the remaining (N−M+1) symbol combinations as a concatenation of an escape code from the first-level VLC table and a codeword from a second-level VLC table.

An aspect of this disclosure includes video encoder 20 coding separately the components of a (run, GTO, EOB) status to reduce the number of candidate symbol combinations for the VLC table. For example, video encoder 20 might only code the run information of a (run, GTO, EOB) status using a codeword from the VLC table, either from the first-level VLC table, or as a concatenation of an escape code from the first-level VLC table and a codeword from a second-level VLC table. Video encoder 20 might code the GTO and EOB information separately from the run information. In another example, video encoder 20 might code only the run information together with partial information about GTO and EOB using codewords from the first-level VLC table. An example of such partial information might be OR(GTO, EOB), where OR represents a logical OR operation. As a result, run and the value of OR(GTO, EOB) can be coded together using a codeword from the VLC table. More detailed information about GTO and EOB can be coded separately. If either or both of the GTO and EOB values are non-zero (i.e. the OR operation is true), then video decoder 26 will process the more detailed information. If both the GTO and EOB values are zero (i.e. the OR operation is false), then video decoder 26 will know that no additional information needs to be decoded.

Aspects of the present disclosure may improve coding efficiency by reducing the total number of symbol combinations that are candidates to be mapped to codewords in the first-level VLC table. In one aspect, a cut-off-run value can be defined for each different size of transform block. Then based on the transform block size and associated cut-off-run value, only symbol combinations associated with a run that is not larger than the cut-off-run value are candidate combinations that may be mapped to a variable length codeword in a first-level VLC table. The symbol combinations associated with a run larger than the cut-off-run value can be coded as a concatenation of an escape code from the first-level VLC table and a codeword from a second-level VLC table. VLC encoding module 98 of entropy encoding unit 46 assigns a first codeword that includes an escape code from the first-level VLC table to a first symbol combination if the first symbol combination indicates a first number of contiguous zero coefficients is greater than the cut-off-run value. VLC encoding module 98 of entropy encoding unit 46 assigns a second codeword to a second symbol combination if the second symbol combination indicates a second number of contiguous zero coefficients is less than or equal to the cut-off-run value. The second codeword is a codeword from the first-level VLC table.

In another aspect, two cut-off-run values, run1 and run2 (with run1≦run2) can be defined for each different size of transform block. Then, based on the transform block size and associated cut-off-run values, entropy encoding unit 46 treats only those symbol combinations associated with a run not larger than run2 as candidate symbol combinations that may be coded using a variable length codeword in the first-level VLC table. However, entropy encoding unit 46 codes only components of the symbol combination associated with a run not larger than run1 in a joint manner (i.e. run, GTO, and EOB can be coded together as one codeword). Entropy encoding unit 46 separately codes components of the symbol combination associated with a run larger than run1. For example, entropy encoding unit 46 might code only the run information of those symbol combinations using a VLC tables (with either a codeword in a first-level VLC table, or as a concatenation of an escape code from the first-level VLC table and a codeword from a second-level VLC table), and code the GTO and EOB information for those symbol combinations separately from the run information.

When utilizing two cut-off-run values (run1 and run2), VLC encoding module 98 of entropy encoding unit 46 assigns a first type of codeword to a symbol combination with run information indicating a number of contiguous zero coefficients is less than or equal to run1 and less than or equal to run2. The first type of codeword may for example include greater-than-one information, end-of-block information, and run information. VLC encoding module 98 of entropy encoding unit 46 assigns a second type of codeword to a symbol combination comprising run information indicating a number of contiguous zero coefficients is less than or equal to run2 and greater than run1. The second type of codeword includes run information and may also include partial greater-than-one and end-of-block information.

In another aspect, for those symbol combinations with runs greater than run1 but less than or equal to run2, entropy encoding unit 46 codes only the run information together with partial information about GTO and EOB using a codeword from a VLC table maintained by VLC tables module 104, either as a codeword in first-level VLC table or as a concatenation of an escape code from the first-level VLC table and a codeword from a second-level VLC table. One example of such partial information can be represented by OR(GTO, EOB), where OR represents a logical OR operation. As a result, entropy encoding unit 46 codes run and the value of OR(GTO, EOB) together using a codeword from a VLC table maintained by VLC tables module 104 and codes more detailed information about GTO and EOB separately.

Aspects of this disclosure, such as limiting the number of candidate symbol combinations for a first-level VLC table based on a single cut-off-run value or multiple cut-off-run values, may improve coding and decoding efficiency, especially for transform blocks larger than 4 by 4.

Additionally, aspects of this disclosure may improve coding efficiency by limiting the number of symbol combinations for which video encoder 20 and video decoder 26 must track occurrence probabilities. For example, a transform block larger than 4 by 4 might have several thousand or even over ten thousand possible symbol combinations for run, GTO, and EOB. Aspects of this disclosure can be used to identify a subset of the total possible symbol combinations that is likely to contain the most frequently occurring symbol combinations. Video encoder 20 and video decoder 26 can then only track the occurrence probabilities for the subset instead of for all possible symbol combinations, thus reducing the amount of processing resources dedicated to tracking occurrence probabilities. Even if some frequently occurring symbol combinations are excluded from the subset, the reduction in processing resources dedicated to tracking occurrence probabilities may still be a net-positive in overall system performance.

For better coding efficiency, video encoder 20 can select an appropriate VLC table from a plurality of VLC tables based on a number of factors, so that for each given circumstance (or context), a different VLC table is used so that codeword length can better match the symbol distribution property for that given circumstance.

Another aspect includes, during the encoding process, VLC encoding module 98 selecting a particular table VLC table maintained by VLC tables module 104 based on the position index of the first zero coefficient of the run associated with the symbol combination to be coded. The coding starts from the first coefficient in the coefficient array. To code a symbol combination, the position index of the first zero coefficient of the run associated with the symbol combination is checked. Then based on the position index value in the scanning order, a VLC table is selected to code the current symbol combination. Again using FIG. 3 as an example, the symbol combinations to be coded are: (1, 1, 0), (1, 0, 0), (2, 0, 1). For symbol combination (1, 1, 0), the position index value of the first zero coefficient of the run is 0. Similarly, for (1, 0, 0) and (2, 0, 1), the position index values are 2 and 4 respectively. In response to receiving a VLC codeword, VLC decoding module 106 can be configured to identify within VLC tables 112, the particular VLC table used by VLC encoding module 98 and to determine the symbol combination from the VLC codeword.

Another aspect of this disclosure includes VLC encoding module 98 selecting a particular VLC table maintained by VLC tables module 104 based on both the previously coded run and level values in the block. The coding starts from the last non-zero coefficient in the coefficient array and is performed in a reverse scanning order. To code a current symbol combination, the levels of all previously coded symbol combinations in the block as well as the run of the previously coded symbol combination are checked. The number of previously coded symbol combinations with a level of 1, together with the run of the previously coded symbol combination, is used as context for coding a current symbol combination. However, if previously coded symbol combinations of the current block include at least a level that is greater than 1, only the run of the previously coded symbol combination is used as context for coding a current symbol combination. Specifically, when forming a context for coding the first symbol combination in a block, the number of previously coded symbol combinations with a level of 1 is set to 1, and the run of the previously coded symbol combination is set as an average of the runs of the first coded symbol combination in a number of previously coded blocks.

The context adaptive VLC tables described above may be designed and constructed for transform coefficients under different coding conditions. Therefore, multiple VLC tables may be available for each context. An aspect of one technique described in this disclosure includes signaling the index of the best VLC table for each context in a slice header. Additionally, symbol combination occurrence probabilities under each context can be accumulated, for example, by a statistics analysis module 100, while blocks in a slice are being coded. Symbol distribution probabilities under each context can be re-evaluated and updated once every certain number of blocks has been coded in the current slice. Then based on the updated symbol distribution property, codewords in the VLC tables can be re-mapped to different symbol combinations for each context. Such accumulation of symbol combination occurrence probabilities and remapping can be performed in the same manner by statistics analysis module 100 and VLC adaptation module 102 of video encoder 20 and the statistics analysis module 108 and VLC adaptation module 110 of video decoder 26. As a result, no additional information needs to be signaled from video encoder 20 to video decoder 26.

The techniques described in this disclosure may be implemented, at least in part, in hardware, software, firmware or any combination thereof. For example, various aspects of the techniques may be implemented within one or more microprocessors, DSPs, ASICs, FPGAs, or any other equivalent integrated or discrete logic circuitry, as well as any combinations of such components, embodied in encoders, laptop, desktop or handheld computers, wireless mobile handsets, set-top boxes, or other devices. The term "processor" or "processing circuitry" may generally refer to any of the foregoing logic circuitry, alone or in combination with other logic circuitry, or any other equivalent circuitry.

Aspects of the techniques described in this disclosure may be implemented in hardware, software, firmware, or any combination thereof. Any features described as modules or components may be implemented together in an integrated logic device or separately as discrete but interoperable logic devices. When implemented in software, the functionality ascribed to the systems and devices described in this disclosure may be embodied as instructions on a non-transitory, computer-readable, storage medium such as RAM, SDRAM, ROM, NVRAM, EEPROM, FLASH memory, magnetic media, optical media, or the like. The term "non-transitory" may indicate that the storage medium is not embodied in a carrier wave or a propagated signal. However, the term "non-transitory" should not be interpreted to mean that storage medium is non-movable. As one example, a storage medium may be removed from a device and moved to another device. As another example, a storage medium may be inserted into a device. In certain examples, a non-transitory storage medium may store data that can, over time, change (e.g., in RAM). The instructions may be executed to support one or more aspects of the functionality described in this disclosure.

The program code may be executed by one or more processors, such as one or more digital signal processors (DSPs), general purpose microprocessors, an application specific integrated circuits (ASICs), field programmable logic arrays (FPGAs), or other equivalent integrated or discrete logic circuitry. Accordingly, the term "processor," as used in this disclosure may refer to any of the foregoing structure or any other structure suitable for implementation of the techniques described. In addition, in some aspects, the functionality described in this disclosure may be provided within dedicated software modules or hardware units configured for encoding and decoding, or incorporated in a combined video encoder-decoder (CODEC).

Many aspects of the disclosure have been described. Various modifications may be made without departing from the scope of the claims. These and other aspects are within the scope of the following claims.

The invention claimed is:

1. A method of variable length coding (VLC), the method comprising:
 identifying run information for a plurality of symbol combinations of a plurality of digital video block coefficients of a transform block, wherein the run information indicates a number of contiguous zero coefficients; and
 coding the run information using a multi-level VLC table, wherein the multi-level VLC table comprises a first-level VLC table and a second-level VLC table, wherein the first-level VLC table maps codewords to symbol combinations, wherein coding the run information further comprises, for a first symbol combination comprising first run information indicating a first number of contiguous zero coefficients is greater than a cut-off-run value, assigning a first codeword to the first symbol combination, wherein the first codeword comprises an escape code from the first-level VLC table.

2. The method of claim 1, further comprising:
 for a second symbol combination comprising second run information indicating a second number of contiguous zero coefficients is less than or equal to the cut-off-run value, assigning a second codeword to the second symbol combination, wherein the second codeword is from the first-level VLC table.

3. The method of claim 1, further comprising:
 for a second symbol combination comprising second run information indicating a second number of contiguous zero coefficients is less than or equal to the cut-off-run value and less than or equal to a second cut-off-run value, assigning a first type of codeword to the second symbol combination, wherein the first type of codeword comprises greater-than-one information, end-of-block information, and the second run information; and
 for a third symbol combination comprising third run information indicating a third number of contiguous zero coefficients is less than or equal to the cut-off-run value and greater than the second cut-off-run value, assigning a second type of codeword to the third symbol combination, wherein the second type of codeword comprises the third run information.

4. The method of claim 3, wherein the second type of codeword further comprises partial greater-than-one and end-of-block information.

5. The method of claim 1, further comprising:
 collecting coding statistics for a set of candidate symbol combinations; and
 adjusting a mapping between codewords of the first-level VLC table and a subset of the set of candidate symbol combinations based on the coding statistics.

6. The method of claim 5, wherein the set of candidate symbol combinations comprises symbol combinations with run information indicating a number of contiguous zero coefficients less than or equal to the cut-off-run value.

7. The method of claim 1, wherein the cut-off-run-value is determined based on a size of the transform block.

8. The method of claim 1, further comprising:
 identifying a particular multi-level VLC table of the a plurality of multi-level VLC tables to be used for a particular symbol combination, based on a context for the symbol combination.

9. The method of claim 8, wherein the context is determined based on a position index of a first zero coefficient of a run of zeros associated with the symbol.

10. The method of claim 8, wherein the context is determined based on previously coded run and level values for the transform block.

11. The method of claim 8, wherein the context is signaled in a slice header.

12. The method of claim 1, wherein the second-level VLC table comprises a structured VLC code.

13. The method of claim 1, wherein the second-level VLC table comprises Golomb-Rice code.

14. The method of claim 1, wherein the method is performed by a video encoding device.

15. The method of claim 1, wherein the method is performed by a video decoding device.

16. A video coding device for coding video data, the video coding device comprising:
 a memory configured to store data defining a multi-level VLC table, wherein the multi-level table comprises a first-level VLC table and a second-level VLC table, wherein the first-level VLC table maps codewords to symbol combinations; and
 a processor configured to assign a first codeword to a first symbol combination, the first symbol combination comprising first run information indicating a first number of contiguous zero coefficients greater than a cut-off-run value, wherein the first codeword comprises an escape code from the first-level VLC table.

17. The video coding device of claim 16, wherein the processor is further configured to:
 assign a second codeword to a second symbol combination comprising second run information indicating a second number of contiguous zero coefficients is less than or equal to the cut-off-run value, wherein the second codeword is from the first-level VLC table.

18. The video coding device of claim 16, wherein the processor is further configured to:
 assign a first type of codeword to a second symbol combination comprising second run information indicating a second number of contiguous zero coefficients is less than or equal to the cut-off-run value and less than or equal to a second cut-off-run value, wherein the first type of codeword comprises greater-than-one information, end-of-block information, and the second run information; and assign a second type of codeword to a third symbol combination comprising third run information indicating a third number of contiguous zero coefficients is less than or equal to the cut-off-run value and greater than the second cut-off-run value, wherein the second type of codeword comprises the third run information.

19. The video coding device of claim 18, wherein the second type of codeword further comprises partial greater-than-one and end-of-block information.

20. The video coding device of claim 16, wherein
the processor is further configured to collect coding statistics for a set of candidate symbol combinations; and
the processor is further configured to adjust a mapping between codewords of the first-level VLC table and a subset of the set of candidate symbol combinations based on the coding statistics.

21. The video coding device of claim 20, wherein the set of candidate symbol combinations comprises symbol combinations with run information indicating a number of contiguous zero coefficients less than or equal to the cut-off-run value.

22. The video coding device of claim 16, wherein the cut-off-run-value is determined based on a size of the transform block.

23. The video coding device of claim 16, wherein
the memory is further configured to store data defining a plurality of multi-level VLC tables; and
the processor is further configured to identify a particular multi-level VLC table of the plurality of multi-level VLC tables to be used for a particular symbol combination, based on a context for the particular symbol combination.

24. The video coding device of claim 23, wherein the context is determined based on a position index of a first zero coefficient of a run of zeros associated with the symbol.

25. The video coding device of claim 23, wherein the context is determined based on previously coded run and level values for the transform block.

26. The video coding device of claim 23, wherein the context is signaled in a slice header.

27. The video coding device of claim 16, wherein the second-level VLC table comprises a structured VLC code.

28. The video coding device of claim 16, wherein the second-level VLC table comprises Golomb-Rice code.

29. The video coding device of claim 16, wherein the video decoding device is a video encoder.

30. The video coding device of claim 16, wherein the video decoding device is a video decoder.

31. A video coding apparatus, the video coding apparatus comprising:
means for identifying run information for a plurality of symbol combinations of a plurality of digital video block coefficients of a transform block, wherein the run information indicates a number of contiguous zero coefficients;
means for storing data defining a multi-level VLC table, wherein the multi-level VLC table comprises a first-level VLC table and a second-level VLC table, wherein the first-level VLC table maps codewords to symbol combinations; and
for a first symbol combination comprising first run information indicating a first number of contiguous zero coefficients is greater than a cut-off-run value, means for assigning a first codeword to the first symbol combination, wherein the first codeword comprises an escape code from the first-level VLC table.

32. The video coding apparatus of claim 31, further comprising:
for a second symbol combination comprising second run information indicating a second number of contiguous zero coefficients is less than or equal to the cut-off-run value, means for assigning a second codeword to the second symbol combination, wherein the second codeword is from the first-level VLC table.

33. The video coding apparatus of claim 31, further comprising:
for a second symbol combination comprising second run information indicating a second number of contiguous zero coefficients is less than or equal to the cut-off-run value and less than or equal to a second cut-off-run value, assigning a first type of codeword to the second symbol combination, wherein the first type of codeword comprises greater-than-one information, end-of-block information, and the second run information; and
for a third symbol combination comprising third run information indicating a third number of contiguous zero coefficients is less than or equal to the cut-off-run value and greater than the second cut-off-run value, assigning a second type of codeword to the third symbol combination, wherein the second type of codeword comprises the third run information.

34. The video coding apparatus of claim 33, wherein the second type of codeword further comprises partial greater-than-one and end-of-block information.

35. The video coding apparatus of claim 31, further comprising:
means for collecting coding statistics for a set of candidate symbol combinations; and
means for adjusting a mapping between codewords of the first-level VLC table and a subset of the set of candidate symbol combinations based on the coding statistics.

36. The video coding apparatus of claim 35, wherein the set of candidate symbol combinations comprises symbol combinations with run information indicating a number of contiguous zero coefficients less than or equal to the cut-off-run value.

37. The video coding apparatus of claim 31, wherein the cut-off-run-value is determined based on a size of the transform block.

38. The video coding apparatus of claim 31, further comprising:
means for storing data defining a plurality of multi-level VLC tables; and
means for identifying a particular multi-level VLC table of the plurality of multi-level VLC tables to be used for a particular symbol combination, based on a context for the symbol combination.

39. The video coding apparatus of claim 38, wherein the context is determined based on a position index of a first zero coefficient of a run of zeros associated with the symbol.

40. The video coding apparatus of claim 38, wherein the context is determined based on previously coded run and level values for the transform block.

41. The video coding apparatus of claim 38, wherein the context is signaled in a slice header.

42. The video coding apparatus of claim 31, wherein the second-level VLC table comprises a structured VLC code.

43. The video coding apparatus of claim 31, wherein the second-level VLC table comprises Golomb-Rice code.

44. The video coding apparatus of claim 31, wherein the video coding apparatus is part of a video encoder.

45. The video coding apparatus of claim 31, wherein the video coding apparatus is part of a video decoder.

46. A non-transitory computer readable storage medium tangibly storing thereon one or more instructions that when executed by one or more processors cause the one or more processors to:
- identify run information for a plurality of symbol combinations of a plurality of digital video block coefficients of a transform block, wherein the run information indicates a number of contiguous zero coefficients;
- access data defining a multi-level VLC table, wherein the multi-level VLC table comprises a first-level VLC table and a second-level VLC table, wherein the first-level VLC table maps codewords to symbol combinations; and
- for a first symbol combination comprising first run information indicating a first number of contiguous zero coefficients is greater than a cut-off-run value, assign a first codeword to the first symbol combination, wherein the first codeword comprises an escape code from a first-level VLC table.

47. The non-transitory computer readable storage medium claim 46, tangibly storing one or more additional instructions, which when executed by the one or more processors cause the one or more processors to:
- for a second symbol combination comprising second run information indicating a second number of contiguous zero coefficients is less than or equal to the cut-off-run value, assign a second codeword to the second symbol combination, wherein the second codeword is from the first-level VLC table.

48. The non-transitory computer readable storage medium of claim 46, tangibly storing one or more additional instructions, which when executed by the one or more processors cause the one or more processors to:
- for a second symbol combination comprising second run information indicating a second number of contiguous zero coefficients is less than or equal to the cut-off-run value and less than or equal to a second cut-off-run value, assign a first type of codeword to the second symbol combination, wherein the first type of codeword comprises greater-than-one information, end-of-block information, and the second run information; and
- for a third symbol combination comprising third run information indicating a third number of contiguous zero coefficients is less than or equal to the cut-off-run value and greater than the second cut-off-run value, assign a second type of codeword to the third symbol combination, wherein the second type of codeword comprises the third run information.

49. The non-transitory computer readable storage medium of claim 48, wherein the second type of codeword further comprises partial greater-than-one and end-of-block information.

50. The non-transitory computer readable storage medium of claim 46, tangibly storing one or more additional instructions, which when executed by the one or more processors cause the one or more processors to:
- collect coding statistics for a set of candidate symbol combinations; and
- adjust a mapping between codewords of the first-level VLC table and a subset of the set of candidate symbol combinations based on the coding statistics.

51. The non-transitory computer readable storage medium of claim 50, wherein the set of candidate symbol combinations comprises symbol combinations with run information indicating a number of contiguous zero coefficients less than or equal to the cut-off-run value.

52. The non-transitory computer readable storage medium of claim 46, wherein the cut-off-run-value is determined based on a size of the transform block.

53. The non-transitory computer readable storage medium of claim 46, tangibly storing one or more additional instructions, which when executed by the one or more processors cause the one or more processors to:
- identify a particular multi-level VLC table of a plurality of multi-level VLC tables to be used for a particular symbol combination, based on a context for the symbol combination.

54. The non-transitory computer readable storage medium of claim 53, wherein the context is determined based on a position index of a first zero coefficient of a run of zeros associated with the symbol.

55. The non-transitory computer readable storage medium of claim 53, wherein the context is determined based on previously coded run and level values for the transform block.

56. The non-transitory computer readable storage medium of claim 53, wherein the context is signaled in a slice header.

57. The non-transitory computer readable storage medium of claim 46, wherein the second-level VLC table comprises a structured VLC code.

58. The non-transitory computer readable storage medium of claim 46, wherein the second-level VLC table comprises Golomb-Rice code.

59. The non-transitory computer readable storage medium of claim 46, wherein the one or more processors are part of a video encoder.

60. The non-transitory computer readable storage medium of claim 46, wherein the one or more processors are part of a video decoder.

* * * * *